(12) United States Patent
Yamada et al.

(10) Patent No.: US 6,844,209 B2
(45) Date of Patent: Jan. 18, 2005

(54) SEMICONDUCTOR DEVICE HAVING A MATRIX ARRAY OF CONTACTS AND A FABRICATION PROCESS THEREOF

(75) Inventors: Naoto Yamada, Kawasaki (JP); Norihiro Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 125 days.

(21) Appl. No.: 10/314,972

(22) Filed: Dec. 10, 2002

(65) Prior Publication Data

US 2003/0085469 A1 May 8, 2003

Related U.S. Application Data

(60) Division of application No. 09/418,568, filed on Oct. 15, 1999, now Pat. No. 6,548,907, which is a continuation-in-part of application No. 09/199,341, filed on Nov. 25, 1998, now abandoned.

(30) Foreign Application Priority Data

Apr. 28, 1998 (JP) .......................................... 10-118266
Apr. 27, 1999 (JP) .......................................... 11-120619

(51) Int. Cl.[7] ........................ G01R 31/26; G01R 31/02; H01L 21/66
(52) U.S. Cl. ............................ 438/18; 438/17; 324/765
(58) Field of Search ............................ 438/15, 16, 17, 438/18, 106, 107, 108, 109, 110, 127; 257/773, 774, 778, 780; 324/754–765

(56) References Cited

U.S. PATENT DOCUMENTS

| | | | | |
|---|---|---|---|---|
| 5,212,403 A | * | 5/1993 | Nakanishi et al. | 257/664 |
| 5,703,402 A | * | 12/1997 | Chu et al. | 257/737 |
| 5,952,726 A | * | 9/1999 | Liang | 257/778 |
| 6,140,710 A | | 10/2000 | Greenberg | 257/786 |
| 6,144,091 A | * | 11/2000 | Washida | 257/693 |
| 6,225,702 B1 | * | 5/2001 | Nakamura | 257/786 |
| 6,246,121 B1 | | 6/2001 | Dandia | 257/778 |
| 6,275,051 B1 | * | 8/2001 | Bachelder et al. | 324/754 |
| 2001/0024127 A1 | * | 9/2001 | Bernier et al. | 324/755 |

FOREIGN PATENT DOCUMENTS

| | | | | |
|---|---|---|---|---|
| JP | 404030544 | | 5/1990 | |
| JP | 403099450 A | * | 4/1991 | H01L/21/66 |

* cited by examiner

*Primary Examiner*—Carl Whitehead, Jr.
*Assistant Examiner*—William C. Vesperman
(74) *Attorney, Agent, or Firm*—Westerman, Hattori, Daniels & Adrian, LLP

(57) ABSTRACT

A semiconductor device includes a semiconductor chip carrying a plurality of contact electrodes on a principal surface thereof, wherein the contact electrodes are arranged symmetrically about an axis of symmetry according to the types of the contact electrodes.

2 Claims, 30 Drawing Sheets

SEMICONDUCTOR DEVICE HAVING A MATRIX ARRAY OF CONTACTS AND A FABRICATION PROCESS THEREOF

CROSS-REFERENCE TO RELATED APPLICATIONS

This application is a Division of prior application Ser. No. 09/418,568 filed Oct. 15, 1999, now U.S. Pat. No. 6,548,907 which is a Continuation-In-Part(CIP) of prior application No. 09/199,341 filed on Nov. 25, 1998 now abandoned.

BACKGROUND OF THE INVENTION

The present invention generally relates to semiconductor devices and more particularly to a fabrication process of a semiconductor device having a matrix array of contacts including a pin grid array or a ball grid array and a fabrication process thereof.

With the advancement in the art of device miniaturization, recent highly integrated LSI chips generally carry a very large number of contact electrodes thereon for external interconnection. For example, there are LSI chips that carry the contact electrodes with a number of several hundreds or even one thousand.

FIG. 1A shows an example of such an LSI chip 1 of the so-called BGA (ball grid array) type in which a number of solder balls 30 are provided on a principal surface 1a thereof in a row and column formation as the contact electrodes. There are LSI chips of this type in which the number of the solder balls 30 exceeds 500. The solder balls 30 on the chip 1 includes power supply terminals 31 and input/output terminals 32.

It should be noted that the fabrication process of a semiconductor device such as an LSI chip 1 includes a testing process of the chip 1, wherein the testing process includes the step of mounting the LSI chip 1 on a testing board in the state that the solder balls 30 are connected electrically to test terminals on the testing board via corresponding contact pins. In the case of recent LSI chips carrying a very large number of solder balls 30 on the chip principal surface 1a, it should be noted that the number of the solder balls 30 can exceed the number of the test terminals provided on the testing board, and there arises a problem in that the testing is not possible for all of the solder balls 30 on the chip 1.

In order to overcome the shortcomings of such a conventional testing process, it is proposed to carry out the testing process according to the process shown in the flowchart of FIG. 2.

Referring to FIG. 2, a number of regions $R_1$–$R_4$ are defined in the step S21 on the principal surface 1a of the LSI chip 1 by boundaries $L_1$ and $L_2$ as indicated in FIG. 1B, such that the number of the solder balls 30 does not exceed the number of the test terminals of the testing board in any of the regions $R_1$–$R_4$. As will be explained later in detail, the test of the LSI chip 1 is conducted for each of the regions $R_1$–$R_4$, while the regions $R_1$–$R_4$ are defined arbitrary. This means that the number or arrangement of the solder balls 30 as well as the type of the terminals provided by the solder balls may be different in each of the regions $R_1$–$R_4$.

Next, one of the regions $R_1$–$R_4$ is selected for testing in the step S22, and a testing board 2a for the region $R_1$ is mounted on a testing apparatus in the step S22b, as will be explained with reference to FIG. 3A. Further, a test program corresponding to the selected region is loaded in the step S23 on a computer cooperating with the testing board.

After the step S23, the LSI chip 1 is mounted on the testing board in the step S24.

FIGS. 3A and 3B show the examples of mounting the LSI chip 1 on the testing board 2a in a bottom view, wherein FIG. 3A shows the LSI chip 1 mounted on the testing board 2a while FIG. 3B shows the LSI chip 1 mounted on a testing board 2b.

Referring to FIG. 3A, the testing board 2a carries thereon test terminals 33 corresponding to the power terminals 31 or the input/output terminals 32 on the selected region $R_1$ of the LSI chip 1, along a periphery of the testing board 2a in electrical connection with contact pins that are provided on the testing board 2a or 2b in rows and columns in correspondence to the solder balls 30 on the LSI chip 1, and the testing is conducted in the step S25 in the state of FIG. 3A while using the test program loaded in the test computer previously in the step S23 of FIG. 2. In FIG. 3A, it should be noted that the contact pins on the testing board 2a are connected to respective, corresponding test terminals 33 via a wiring pattern 34.

Based on the result of the testing in the step S25, a discrimination step S26 is conducted for discriminating whether or not the tested region $R_1$ of the LSI chip 1 is defect-free, and if the result is NO, the chip 1 is discarded in the step S27.

Next, in the step S28, a discrimination is made whether or not all the LSI chips 1 are tested, and if the result is NO, the tested LSI chip 1 is dismounted from the testing board 2a and a next LSI chip 1 is mounted such that the region $R_1$ of the next LSI chip 1 is tested.

Further, in the step S29, a discrimination is made whether or not all the regions $R_1$–$R_4$ of all the LSI chips 1 are tested, and if the result is NO, the first LSI chip 1 is mounted on the second testing board 2b of FIG. 3B for testing of the region $R_2$. It should be noted that the testing board 2b is designed for testing the region $R_2$ and carries a wiring pattern 34' different from the wiring pattern 34 provided on the testing board 2a for testing the region $R_1$. Thereby, the steps S22–S29 are repeated for the all the regions $R_2$–$R_4$.

However, the foregoing testing process has a drawback in that it is necessary to provide a number of testing boards 2a and 2b in correspondence to arbitrarily defined regions $R_1$–$R_4$. It should be noted that the wiring pattern 34 has to be changed in each of the testing boards in correspondence to the selected regions $R_1$–$R_4$ even though the testing boards may have the same row and column arrangement of the contact pins. Further, the testing program has to be changed in each of the regions $R_1$–$R_4$ and hence in each of the testing boards. Thereby, the cost of the testing of the LSI chip increases inevitably.

Further, the foregoing testing process has a drawback in that it requires a large number of testing steps including loading and unloading of the testing programs, mounting and dismounting of the LSI chips, and the like.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device and a fabrication process thereof wherein the number of testing steps for testing the fabricated semiconductor device is reduced.

Another object of the present invention is to provide a semiconductor device and a fabrication process thereof wherein the number of testing boards used for testing the fabricated semiconductor device is reduced.

Another object of the present invention is to provide a semiconductor device and a fabrication process thereof wherein the number of testing programs used for testing the fabricated semiconductor device is reduced.

Another object of the present invention is to provide a semiconductor device, comprising:

a semiconductor chip; and a plurality of contact electrodes provided on a principal surface of said semiconductor chip, said plurality of contact electrodes carrying signals of respective types, said plurality of contact electrodes being disposed on said principal surface of said semiconductor chip such that a first contact electrode included in said plurality of contact electrodes and carrying a signal of a first type is disposed symmetrically with respect to a second contact electrode included in said plurality of contact electrodes and carrying a signal of said first type about a hypothetical center of axial symmetry located on said principal surface of said semiconductor chip.

Another object of the present invention is to provide a method of fabricating a semiconductor device including a step of testing said semiconductor device, said step of testing comprising the steps of:

defining, in a principal surface of a semiconductor chip forming said semiconductor device, a plurality of regions each including a plurality of contact electrodes such that a first contact electrode provided in a first region for carrying signals of a first type, is in a symmetrical relationship with a second contact electrode in a second region and used for carrying a signal of said first type, about a center of axial symmetry locating in said principal surface;

mounting said semiconductor chip on a testing board in a first state such that said first contact electrode is contacted with a corresponding first contact pin provided on said testing board;

carrying out a testing of said semiconductor chip by using said first contact electrode;

rotating said semiconductor chip with respect to said testing board about said center of axial symmetry, such that said second contact electrode is contacted with said first contact pin of said testing board; and carrying out a testing of said semiconductor chip by using said second contact electrode.

According to the present invention, it is possible to align the contact electrodes on the semiconductor chip, when the semiconductor device is mounted on a testing board carrying thereon contact pins in correspondence to the contact electrodes on the semiconductor chip, in any of first and second regions defined on the principal surface of the semiconductor chip, such that contact electrodes are aligned with the contact pins on the testing board according to the types of the signals; by merely rotating the semiconductor chip about the foregoing center of axial symmetry. Thereby, the number of the testing boards necessary for the testing is reduced and the cost of the semiconductor device is reduced. Further, the present invention uses only one testing program for the testing of the entire LSI chip and the time needed for writing test programs for each of the testing boards is reduced. In addition, the time needed for loading and unloading the testing programs is reduced.

Another object of the present invention is to provide a semiconductor device and a fabrication process thereof wherein the number of the testing boards used for testing the fabricated semiconductor device is reduced and the number of the testing programs used for testing the fabricated semiconductor device is reduced, while simultaneously guaranteeing a flexible designing of the semiconductor device.

Another object of the present invention is to provide a testing method of a semiconductor device by using a testing board, said semiconductor device having a mounting surface including a plurality of regions, each of said plurality of regions carrying a plurality of terminals with a number smaller than a number of test terminals provided on said testing board, said method comprising the steps of:

loading a first socket on said testing board, said first socket connecting terminals in a first region of said mounting surface of said semiconductor device to corresponding testing terminals on said testing board in a state in which said semiconductor device is mounted on said first socket;

mounting said semiconductor device on said first socket;

testing said semiconductor device in said state in which said semiconductor device is mounted on said first socket;

dismounting said semiconductor device from said first socket;

loading a second socket on said testing board, said second socket connecting terminals in a second region of said mounting surface of said semiconductor device to corresponding testing terminals on said testing board in a state in which said semiconductor device is mounted on said second socket;

mounting said semiconductor device on said second socket;

testing said semiconductor device in said state in which said semiconductor device is mounted on said second socket.

According to the present invention, the correspondence between the terminals on the semiconductor device and the testing terminals on the testing board is maintained as a result of the use of the sockets, and the testing of the semiconductor device can be achieved while using the same testing board and the same testing program. By using the sockets in combination with the testing apparatus, the axial symmetry for the arrangement of the terminals is no longer required in the semiconductor device, and the degree of freedom for designing the semiconductor device is increased.

Other objects and further features of the present invention will become apparent from the following detailed description when read in conjunction with the attached drawings.

DETAILED DESCRIPTION OF THE PREFERRED EMBODIMENTS

[First Embodiment]

Figure 4:
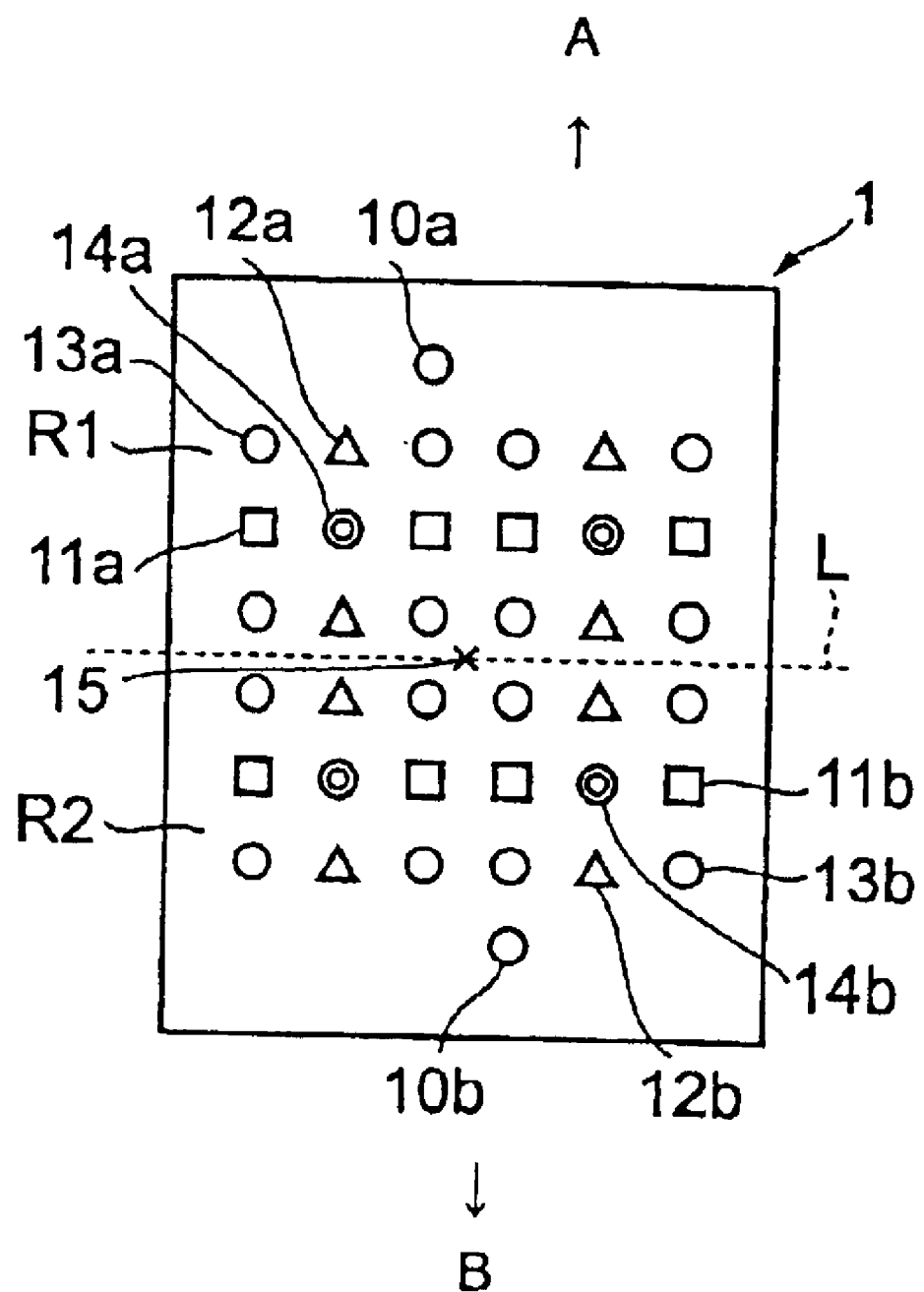
FIG. 4 is a diagram showing the construction of a semiconductor chip according to a first embodiment of the present invention in a bottom view.

FIG. 4 shows the construction of an LSI chip 1 according to a first embodiment of the present invention in a bottom view.

Referring to FIG. 4, the LSI chip 1 carries, on a bottom surface thereof, various contact electrodes including TAP (test access port) terminals 10a and 10b, power supply terminals (VDD) 11, ground terminals (GND) 12, signal input terminals 13 and signal output terminals 14, wherein it should be noted that the bottom surface of the LSI chip 1 is divided into a first region $R_1$ and a second region $R_2$ by a boundary line L. Thereby, the foregoing terminals are also divided into two groups such that the terminals in the first region $R_1$ are symmetrical with the corresponding terminals in the second region $R_2$ about a form center 15 of the LSI chip 1. In other words, there is a diad axis in correspondence to the form center 15.

For example, the TAP terminal 10a in the region $R_1$ is formed such that the terminal 10a coincides with the corresponding TAP terminal 10b in the region $R_2$ when the LSI chip 1 is rotated by 180° about the foregoing center 15. Similarly, the power supply terminal 11a in the region $R_1$ is formed such that the terminal 11a coincides with the power supply terminal 11b in the region $R_2$ when the LSI chip 1 is rotated by 180° about the center 15. Further, the ground terminal 12a in the region $R_1$ is formed such that the terminal 12a coincides with the corresponding ground terminal 12b in the region $R_2$ when the LSI chip 1 is rotated by 180° about the center 15, the input terminal 13a in the region $R_1$ is formed such that the terminal 13a coincides with the corresponding input terminal 13b in the region $R_2$ when the LSI chip 1 is rotated by 180° about the center 15, and the output terminal 14a in the region $R_1$ is formed such that the terminal 14a coincides with the corresponding output terminal 14b in the region $R_2$ when the LSI chip 1 is rotated by 180° about the center 15.

Thus, it should be noted that the contact electrodes 11–14 are arranged symmetrically on the bottom surface of the LSI chip 1 in the example of FIG. 4 about the form center 15 acting as a diad axis.

Figure 5:
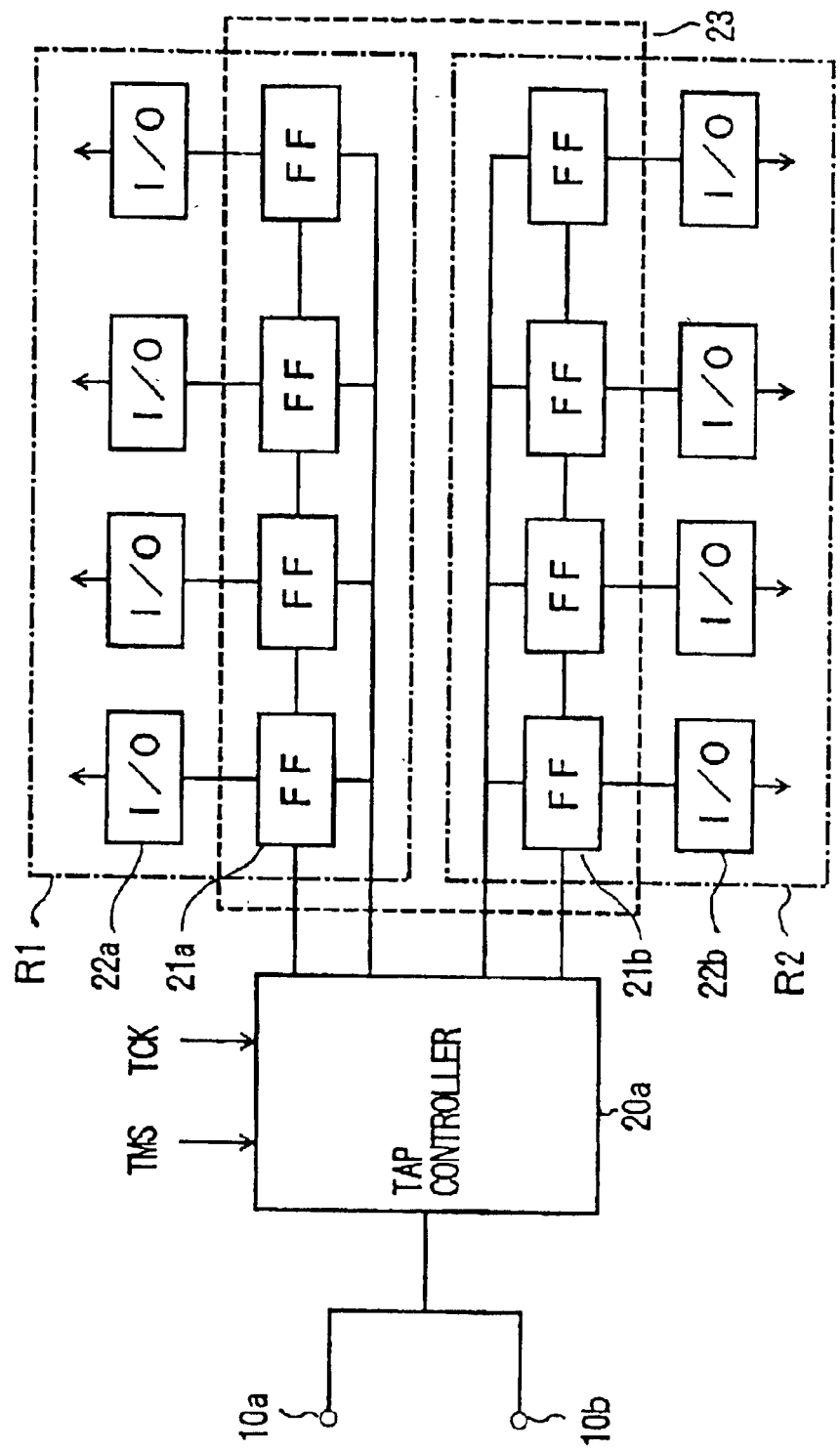
FIG. 5 is a circuit diagram showing an example of electrical connection used in the embodiment of the present invention.

FIG. 5 shows the circuit construction of the LSI chip 1, wherein those parts corresponding to the parts described previously are designated by the same reference numerals and the description thereof will be omitted.

Referring to FIG. 5, the LSI chip 1 further includes a TAP controller 20a in electrical connection with the foregoing TAP terminals 10a and 10b and a scan circuit 23 is connected to the TAP controller 20, wherein the TAP controller 20 is supplied with a test mode control signal TMS and a test clock signal TCK. Further, the LSI chip 1 includes input/output terminals 22a and 22b respectively provided on the region $R_1$ and the region $R_2$.

The scan circuit 23 includes a flip-flop circuit 21a connected to the input/output terminal 22a wherein the flip-flop circuit 21a holds the state thereof in response to a clock signal from the TAP controller 20. Further, the scan circuit 23 includes another flip-flop circuit 21b connected to the input/output terminal 22b wherein the flip-flop circuit 21b holds the state thereof in response to a clock signal from the TAP controller 20.

Thus, when a control signal is supplied to the TAP controller 20 via the TAP terminal 10a in the region $R_1$ or via the TAP terminal 10b in the region $R_2$, the part of the testing circuit corresponding to the side of the chip 1 to be tested, such as the side of the region $R_1$, is selectively activated and the input/output terminals 22a are consecutively activated in response to a predetermined reference clock by activating the flip-flop circuits 21a consecutively. In this state, the flip-flop circuits 21b for the region $R_2$ are deactivated so that there is no leakage path formed at the input/output terminals 22b. In response to this, the input/output terminals 22b are held at a high-impedance state.

In the scan circuit 23, it should be noted that the order of the scan path of the input/output terminals 22a or 22b is set the same in the region $R_1$ and in the region $R_2$.

Figure 6:
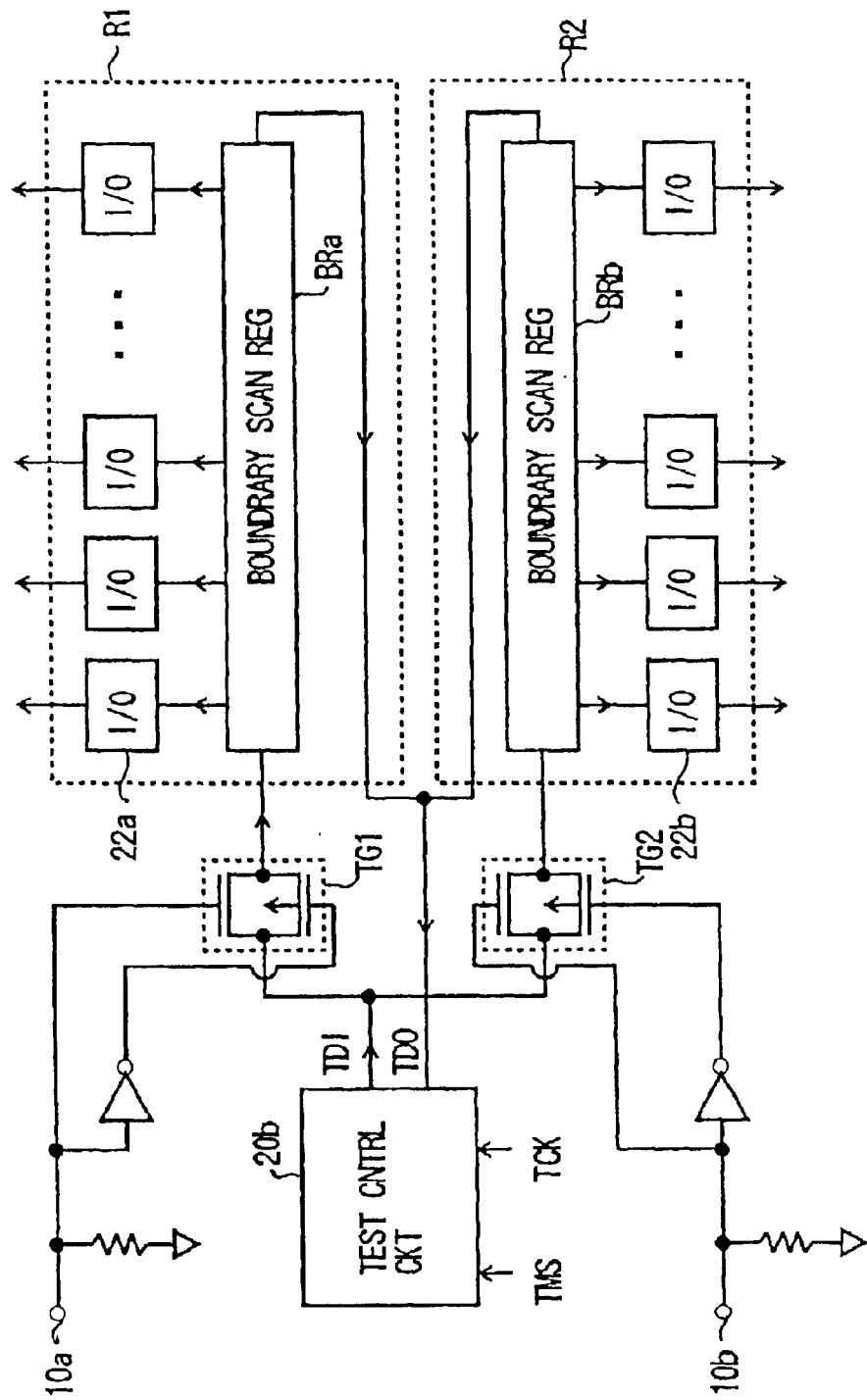
FIG. 6 is a circuit diagram showing the construction of a testing circuit in detail.

FIG. 6 shows the construction of the circuit of FIG. 5 in detail.

Referring to FIG. 6, the circuit includes a boundary scan register BRa in correspondence to the region $R_1$ in cooperation with the input/output terminals 22a and another boundary scan register BRb corresponding to the region $R_2$ in cooperation with the input/output terminals 22b. Further, the circuit of FIG. 6 includes a test control circuit 20b to which the test mode control signal TMS and the test clock signal TCK are supplied.

Between the test control circuit 20b and the boundary scan register BRa, there is provided a transfer gate TG1. Further, another transfer gate TG2 is provided between the test control circuit 20b and the boundary scan register BRb. The transfer gate TG1 is controlled by the signal supplied to the TAP terminal 10a while the transfer gate TG2 is controlled by the signal supplied to the TAP terminal 10b.

In the circuit of FIG. 6, a test command signal and a test data signal (TDI) are supplied from the test control circuit 20b to the boundary scan register BRa and BRb. Thus, in the case the region $R_1$ is selected to be the region for testing, a high level signal is supplied to the TAP terminal 10a and the transfer gate transistor TG1 is turned on. In response to the turning-on of the gate transfer transistor TG1, the TDI signal is transferred from the control circuit 20b to the boundary scan register BRa. As a result of this, the input/output terminals 22a of the region $R_1$ are set ready for testing, and the desired test is conducted.

During this state of testing the region $R_1$, it should be noted that a low level signal is supplied to the TAP terminal 10b, and the transfer gate transistor TG2 is turned off. Thereby, no transfer of the TDI signal occurs from the control circuit 20b to the boundary scan register BRb.

In the construction of FIG. 6, it should further be noted that a data signal TDO, which is produced by the boundary scan register BRa, is supplied to the test control circuit 20b.

Next, the testing process according to the present invention using the LSI chip 1 will be described with reference to the flowchart of FIG. 7.

Figure 7:
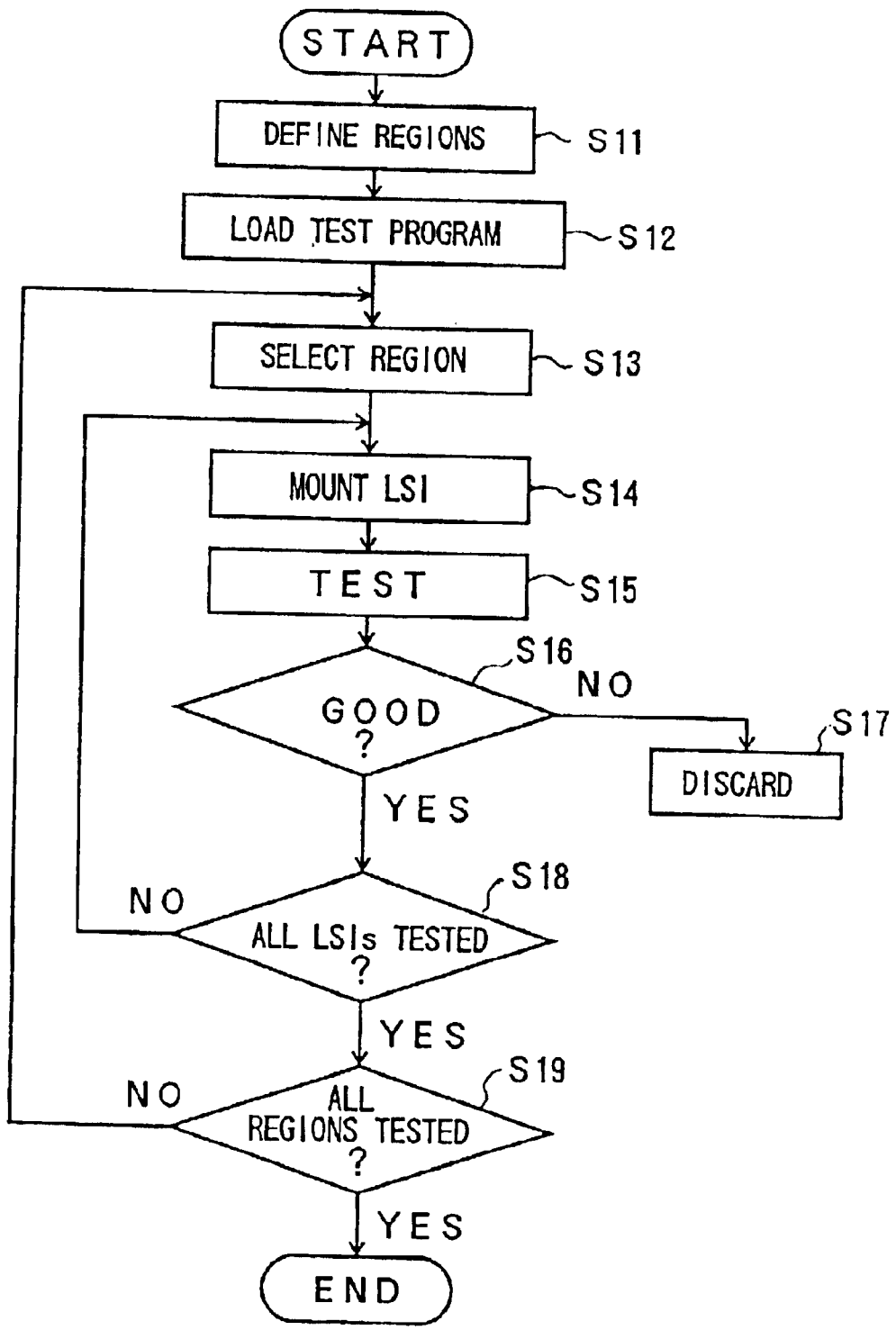
FIG. 7 is a flowchart showing the testing process used in the embodiment of the present invention.

Referring to FIG. 7, the process starts with a step S11 in which the regions $R_1$ and $R_2$ are defined on the principal surface of the LSI chip 1 as indicated in FIG. 4 such that the contact electrodes 11–14 are grouped into a first group 11a–14a for the region $R_1$ and a second group 11b–14b for the region $R_2$. The regions $R_1$ and $R_2$ are defined such that the number of the contact electrodes does not exceed the number of the contact pins of the testing board used for testing the LSI chip 1 in any of the regions $R_1$ and $R_2$. As noted already, the contact electrodes on the LSI chip 1 are disposed symmetrically about the form center 15 of the chip 1 according to the types of the contact electrodes. The form center 15 thereby coincides with the diad axis.

Next, a test program is loaded on a computer cooperating with a testing board used for testing the LSI chip 1 in the step S12, and the region for testing is selected in the step S13. For example, the region $R_1$ is selected for testing in the step S13.

Figure 1A:
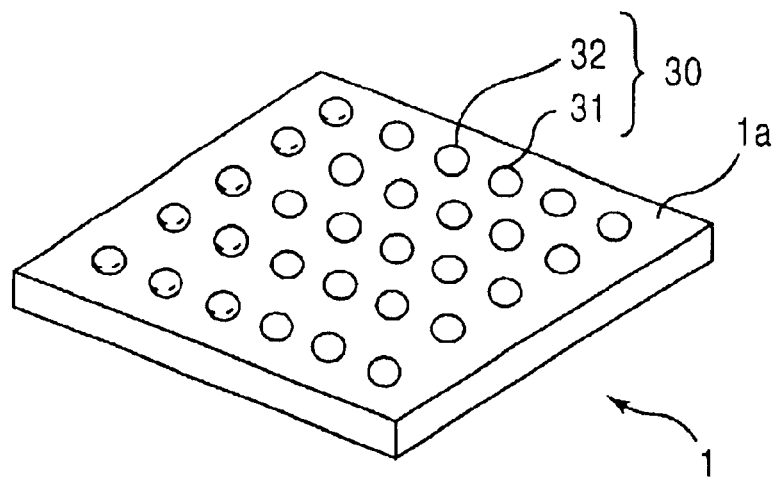
FIGS. 1A and 1B are diagrams showing the construction of a conventional semiconductor chip.
Figure 1B:
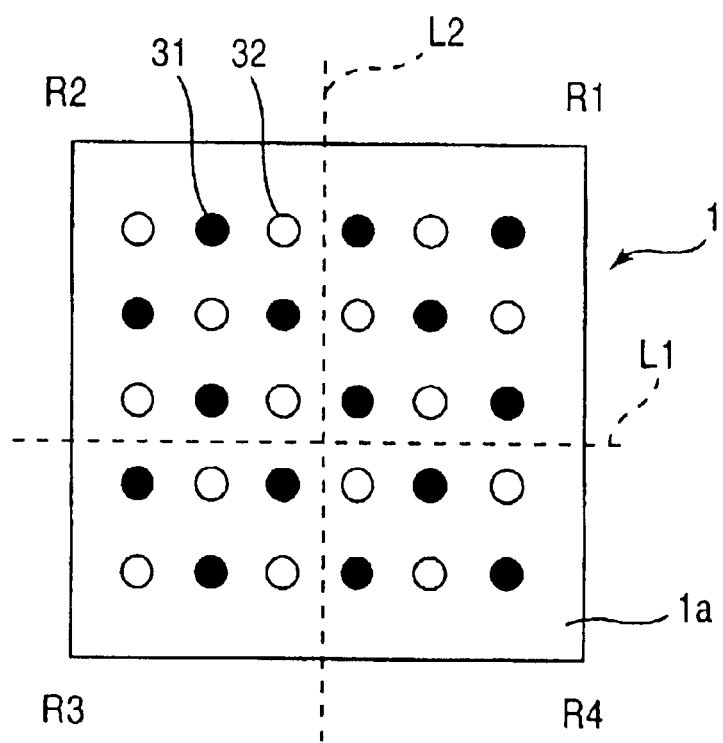
Figure 2:
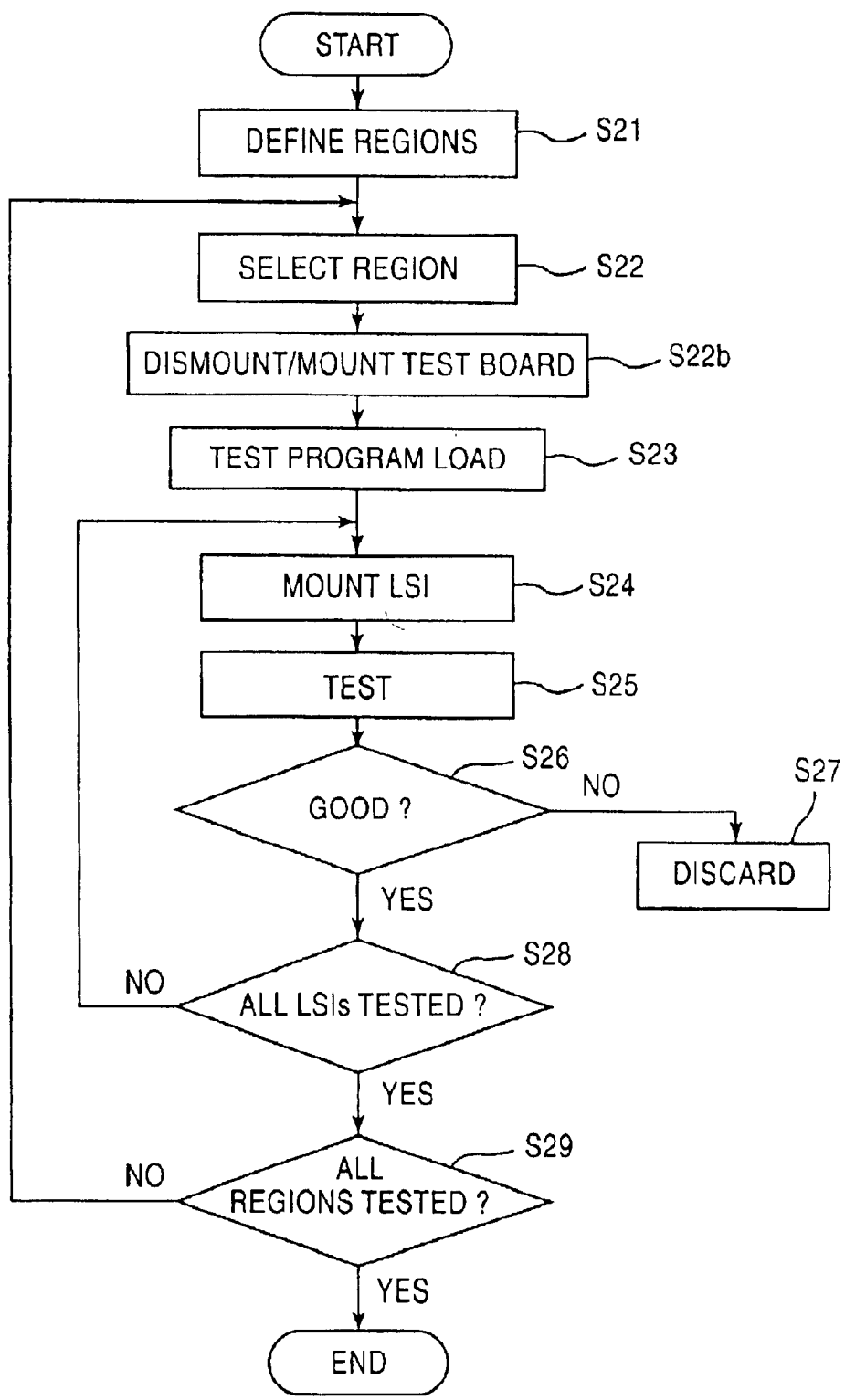
FIG. 2 is a flowchart showing the testing process used conventionally for testing a semiconductor device.
Figure 3A:
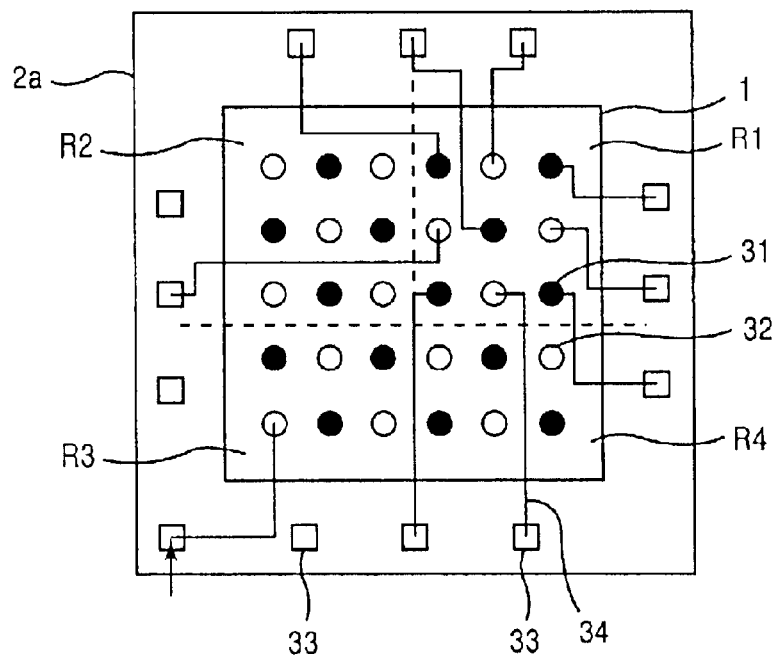
FIGS. 3A and 3B are diagrams showing an example of the testing conducted according to the process of FIG. 2.
Figure 3B:
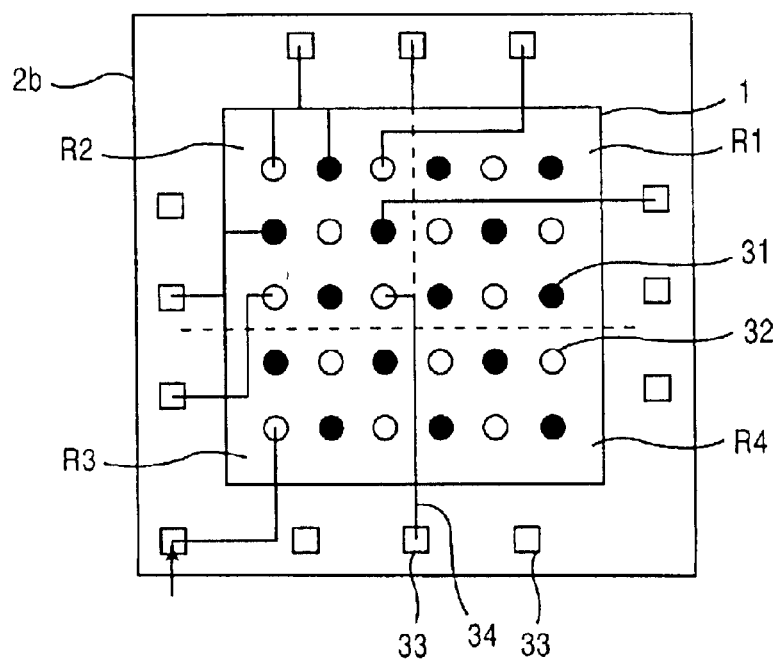
Figure 8A:
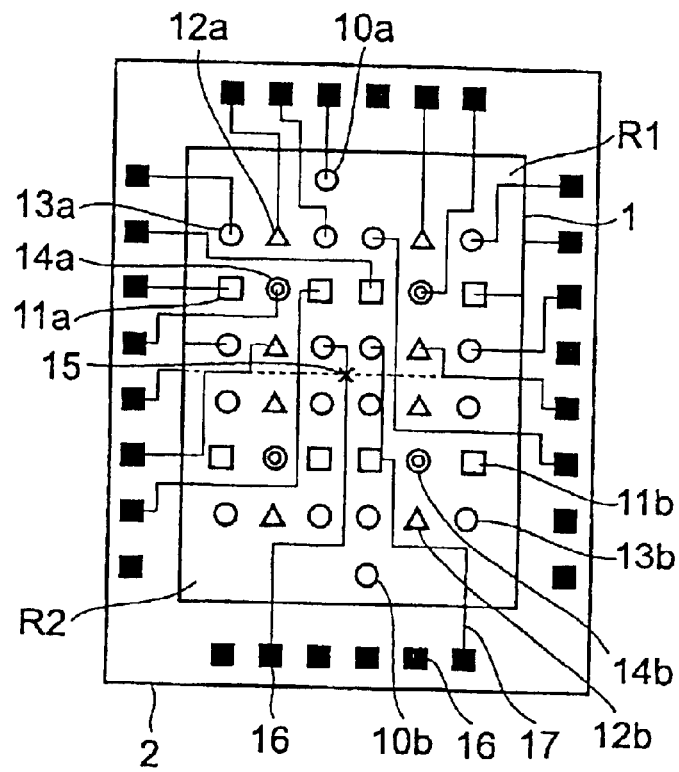
FIGS. 8A and 8B are diagrams showing an example of the testing conducted according to the process of FIG. 6.

Next, the LSI chip 1 is mounted on a testing board 2 in the step S14 in a first orientation as indicated by an arrow A of FIG. 4, such that the contact electrodes 10a–14a of the region $R_1$ are contacted with the corresponding contact pins of the testing board 2 as indicated in FIG. 8A. It should be noted that FIG. 8A shows the testing board in a bottom view similarly to the bottom view of FIGS. 3A or 3B. Similarly as before, the testing board 2 carries terminal pads 16 connected to the corresponding contact pins by a conductor pattern 17, wherein the terminal pads 16 are arranged along a periphery of the testing board 2.

Further, the testing of the LSI chip 1 is carried out in the step S15 in the state that the LSI chip 1 is held on the testing board 2 as indicated in FIG. 8A, and a discrimination is made whether or not the tested LSI chip 1 is defect-free. If the result of the step S16 is NO, the LSI chip 1 is discarded in the step S17.

Further, a discrimination is made in the step S18 whether or not all the LSI chips 1 are tested, and if not, the process returns to the step S14 and a next LSI chip 1 is mounted on the testing board. Thereby, the steps S14–S18 are repeated, until all the LSI chips 1 are tested with respect to the regions $R_1$.

Next, in the step S19, a discrimination is made as to whether or not all the regions $R_1$ and $R_2$ on the LSI chips 1 are tested, and if the result of the step S19 is NO, the process returns to the step S13 and the next region $R_2$ is selected for testing.

Further, the LSI chip 1 is mounted on the same testing board used previously in the step S14 for testing the region $R_1$, with an orientation such that the LSI chip 1 is turned by 180° about the form center 15 thereof with respect to the state of FIG. 8A as indicated by the arrows A and B.

Figure 8B:
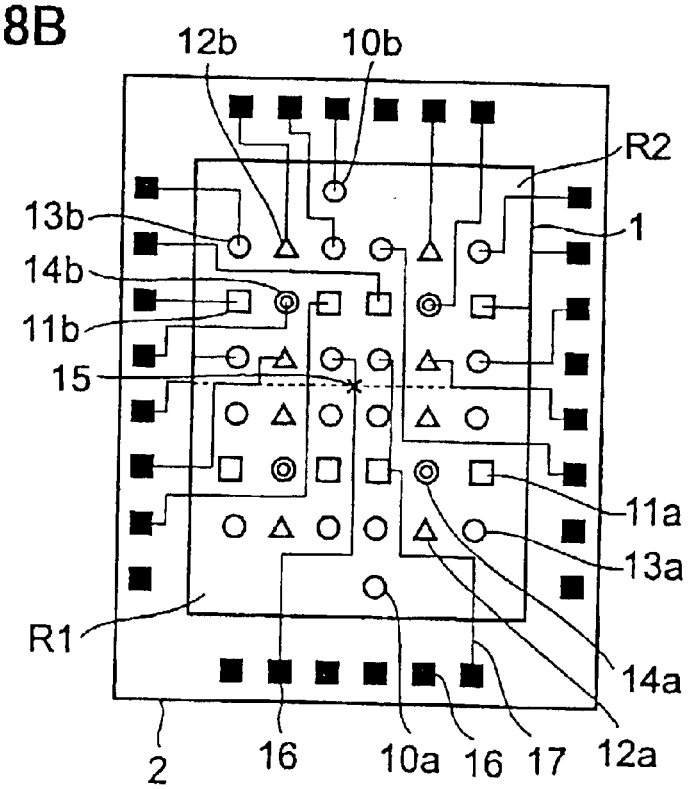

In the state of FIG. 8B, the LSI chip 1 is tested for the region $R_2$ in the step S15 and a discrimination is made in the step S16 similarly as before. Further, defective LSI chips 1 are discarded in the step S17 and the process of looping back from the step S18 to the step S14 is conducted until all the LSI chips 1 are tested for the region $R_2$. After all the LSI chips 1 are thus tested for the region $R_2$, the result of the step S19 becomes YES and the testing process is thus terminated.

In FIGS. 8A and 8B, it should be noted that the same testing board 2 is used for testing the regions $R_1$ and $R_2$ of the LSI chip 1. Thereby, the same wiring pattern 17 is used for connecting the contact pins to the corresponding terminal pads 16.

According to the present invention, it is possible to test the regions $R_1$ and $R_2$ of the LSI chip 1 by using the same testing board 2 by merely rotating the orientation of the LSI chip 1 on the testing board 2 by 180° about the center of axial symmetry. Further, the same testing program can be used for the testing of the regions $R_1$ and $R_2$, and the time for unloading and loading the test program in the step S12 is reduced. Associated therewith, the time for writing the testing programs is reduced substantially.

Of course, the present invention is not limited to the LSI chip 1 of FIG. 4 having only two regions $R_1$ and $R_2$ but is applicable to LSI chips having three or more regions, as long as the contact electrodes 11–14 are arranged symmetrically about a central axis of symmetry. While it is convenient to choose the foregoing symmetry axis coincident to the form center 15 of the LSI chip 1, it is possible to set the symmetry axis offset from the form center 15 of the LSI chip 1.

[Second Embodiment]

Figure 9:
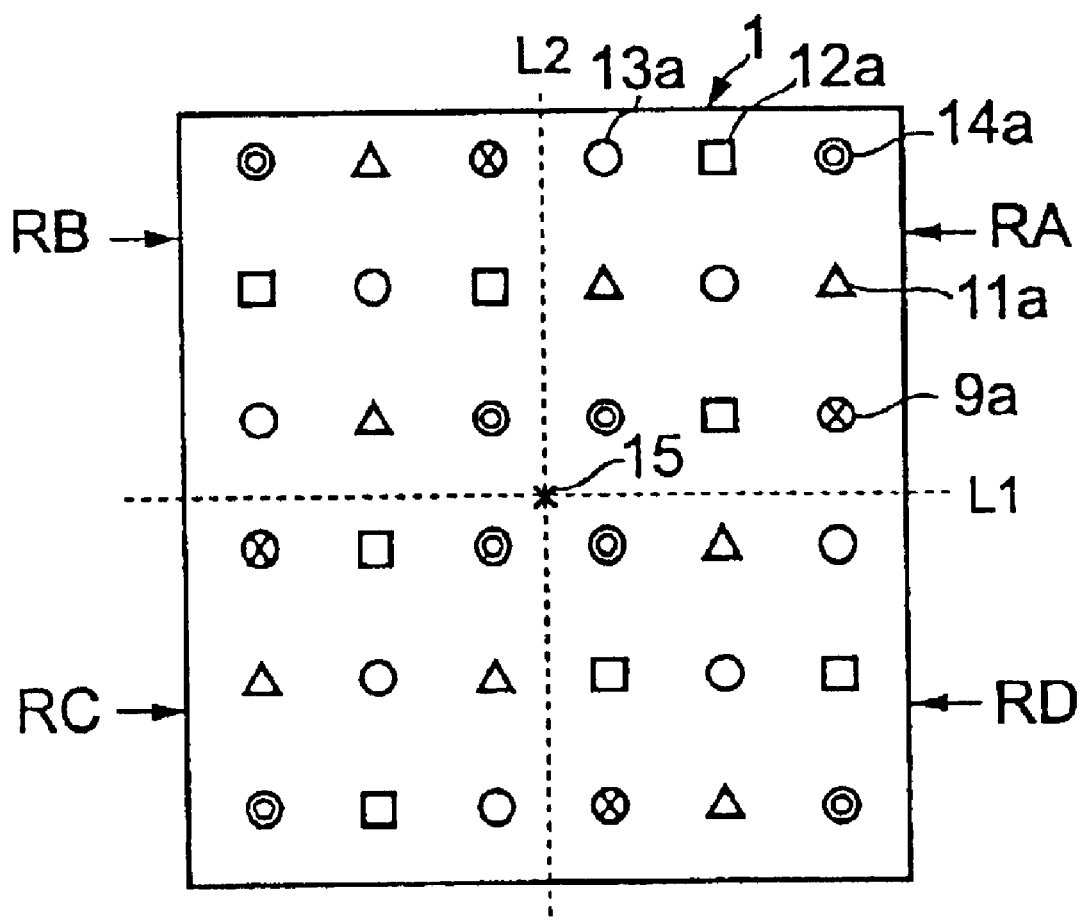
FIG. 9 is a diagram showing the construction of a semiconductor chip according to a second embodiment of the present invention in a bottom view.

FIG. 9 shows the bottom view of the LSI chip 1 according to a second embodiment of the present invention, wherein those parts corresponding to the parts described previously are designated by the same reference numerals and the description thereof will be omitted.

Referring to FIG. 9, the LSI chip 1 of the present invention has a bottom surface divided into regions RA–RD by the boundary lines $L_1$ and $L_2$, wherein the region RA includes a test control terminal 9a, a power (VDD) terminal 11a, a power (GND) terminal 12a, a signal input terminal 13a and a signal output terminal 14a.

Similarly to the first embodiment, the foregoing terminals are arranged symmetric with respect to the form center 15 such that the each terminal comes to the overlapping location of a terminal of the same kind after rotation about the foregoing form center 15 by an angle of 90°. In other words, there appears a 90-degree axial symmetry in the bottom surface of the LSI chip 1.

Figure 10:
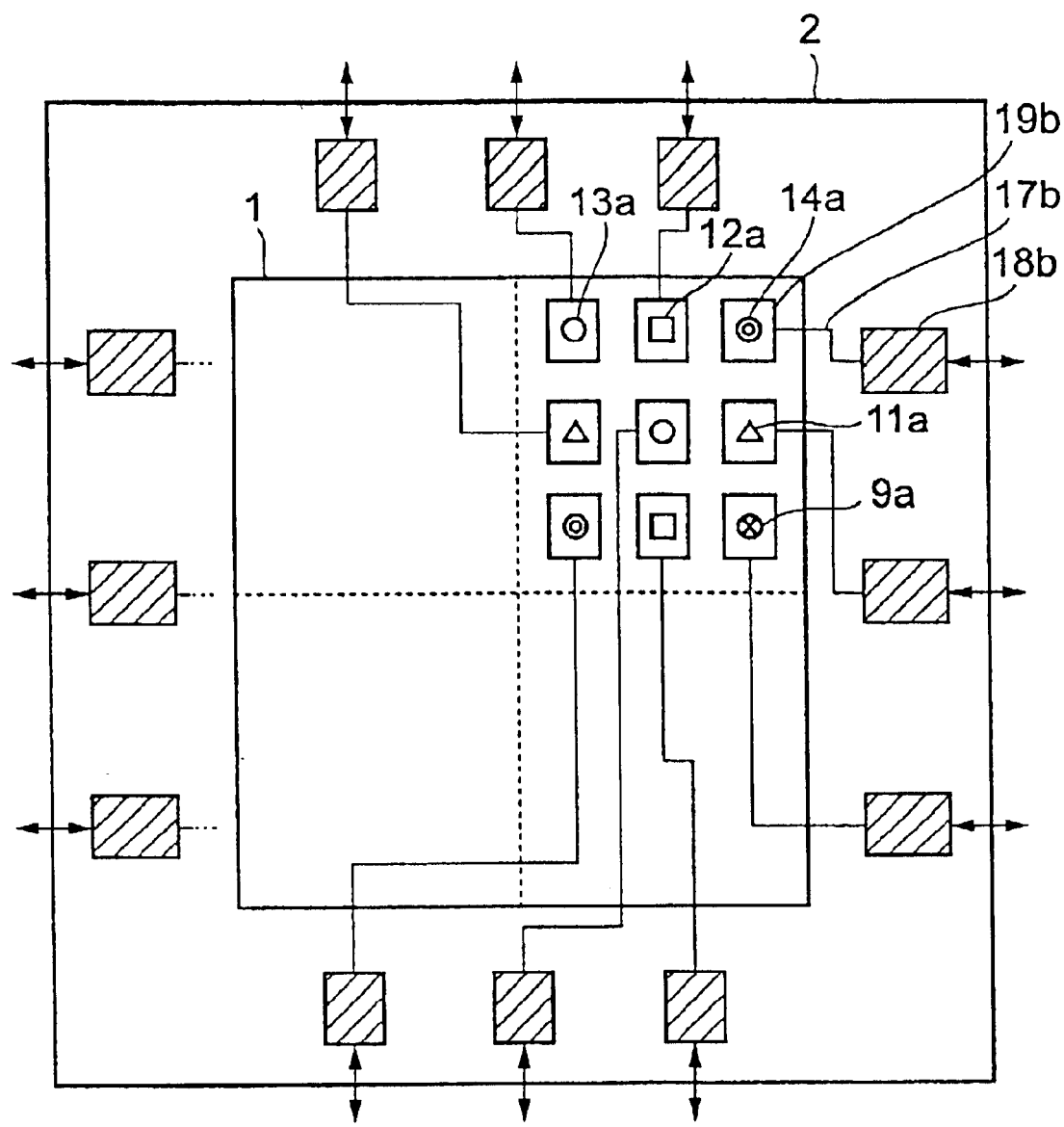
FIG. 10 is a diagram showing the construction of a testing board in the state in which the semiconductor chip of FIG. 9 is mounted thereon.

FIG. 10 shows the construction of a testing board 2 in the state in which the LSI chip 1 of FIG. 9 is mounted thereon.

Referring to FIG. 10, the testing board 2 includes terminals 19b provided in correspondence to the terminals on the bottom surface of the LSI chip 1 and connection terminals 18b connected to a tester channel, wherein each of the terminals 19b is connected to a corresponding connection terminal 18b via a wiring 17b. Thereby, a test signal is supplied from a tester not shown to the connection terminal 18b based on a test program, and the functional testing is conducted for each of the divided regions.

[Third Embodiment]

In the foregoing first and second embodiments, there arises problems noted below.

The first problem arises in relation to the mode of mounting of the LSI chip 1 on the testing board 2, in that the LSI chip 1 is mounted on the testing board 2 in the progressively rotated state. In view of the fact that the same testing program is used throughout in the foregoing embodiments, there arises a difficulty in relating the result of the testing and the region of the LSI chip 1 that has been tested. Further, there arises a difficulty to recognize whether or not the entire regions of the LSI chip 1 have been tested.

The second problem is that, due to the requirement of axial symmetry in the arrangement of the terminals, the degree of freedom in designing the LSI chip is reduced substantially.

Figure 11:
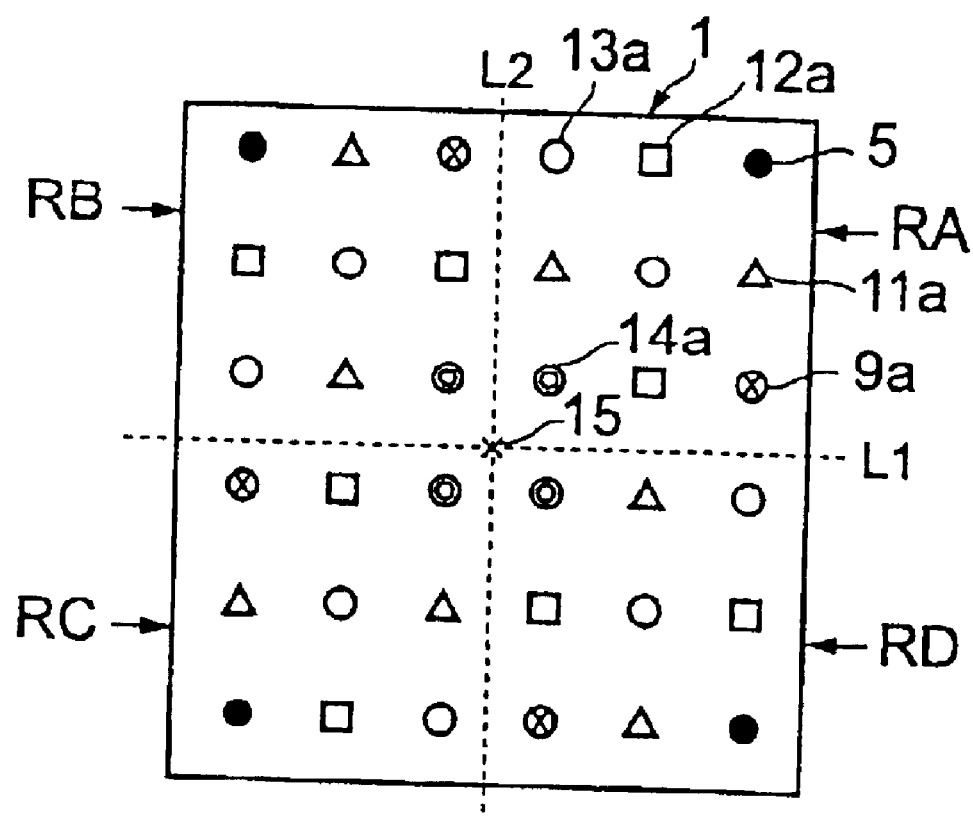
FIG. 11 is a diagram showing the construction of a semiconductor chip according to a third embodiment of the present invention.

FIG. 11 shows the bottom view of the LSI chip 1 according to a third embodiment of the present invention in which the foregoing first problem is addressed, wherein those parts of FIG. 11 corresponding to the parts described previously are designated by the same reference numerals and the description thereof will be omitted.

Referring to FIG. 11, the bottom surface of the LSI chip 1 is divided into regions RA–RD by the borders $L_1$ and $L_2$ similarly to the previous embodiments, wherein each of the regions RA–RD thus defined includes, in addition to the test control terminal 9a, the power ($V_{DD}$) terminal 11a, the power (GND) terminal 12a, the signal input terminal 13a and the signal output terminal 14a, an index terminal 5.

In each of the regions RA–RD, the terminals are arranged symmetrically about the form center 15, such that the each of the terminals of a region, such as the region RA, overlaps with a corresponding terminal of the adjacent region, such as the region RB, when the LSI chip 1 is rotated about the form center 15 by an angle of 90 degrees.

Thereby, the index terminal 5 in each region RA–RD is used to produce a discrimination signal for discriminating the region from other regions. The index terminals 5 are arranged in axial symmetry about the form center 15 similarly to other terminals on the LSI chip 1. By using the discrimination signal, it becomes possible to relate the result of the testing with the regions in which the test has been made.

Figure 12:
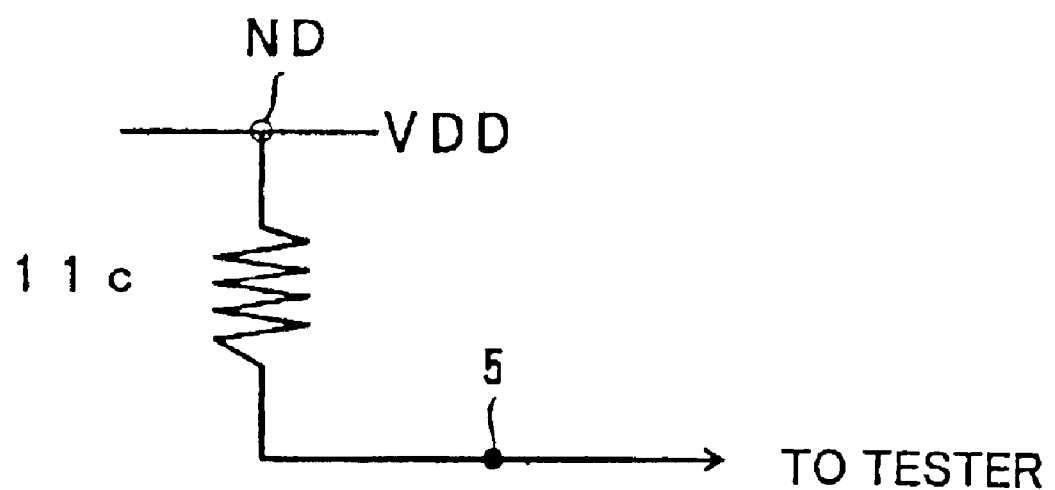
FIG. 12 is a circuit diagram showing the construction of a discrimination signal generation circuit used in the third embodiment.

FIG. 12 shows the construction of a circuit for generating the foregoing discrimination signal to be supplied to the index terminals 5.

Referring to FIG. 12, the discrimination signal generation circuit includes a node ND to which the power supply voltage $V_{DD}$ is supplied and a resistor 11c, wherein the resistor 11c supplies the foregoing power supply voltage $V_{DD}$ to the index terminal 5 after a voltage drop, wherein the magnitude of the voltage drop is changed between the regions RA–RD. Thereby, it becomes possible to identify the region by measuring the voltage at the index terminal 5.

Figure 13:
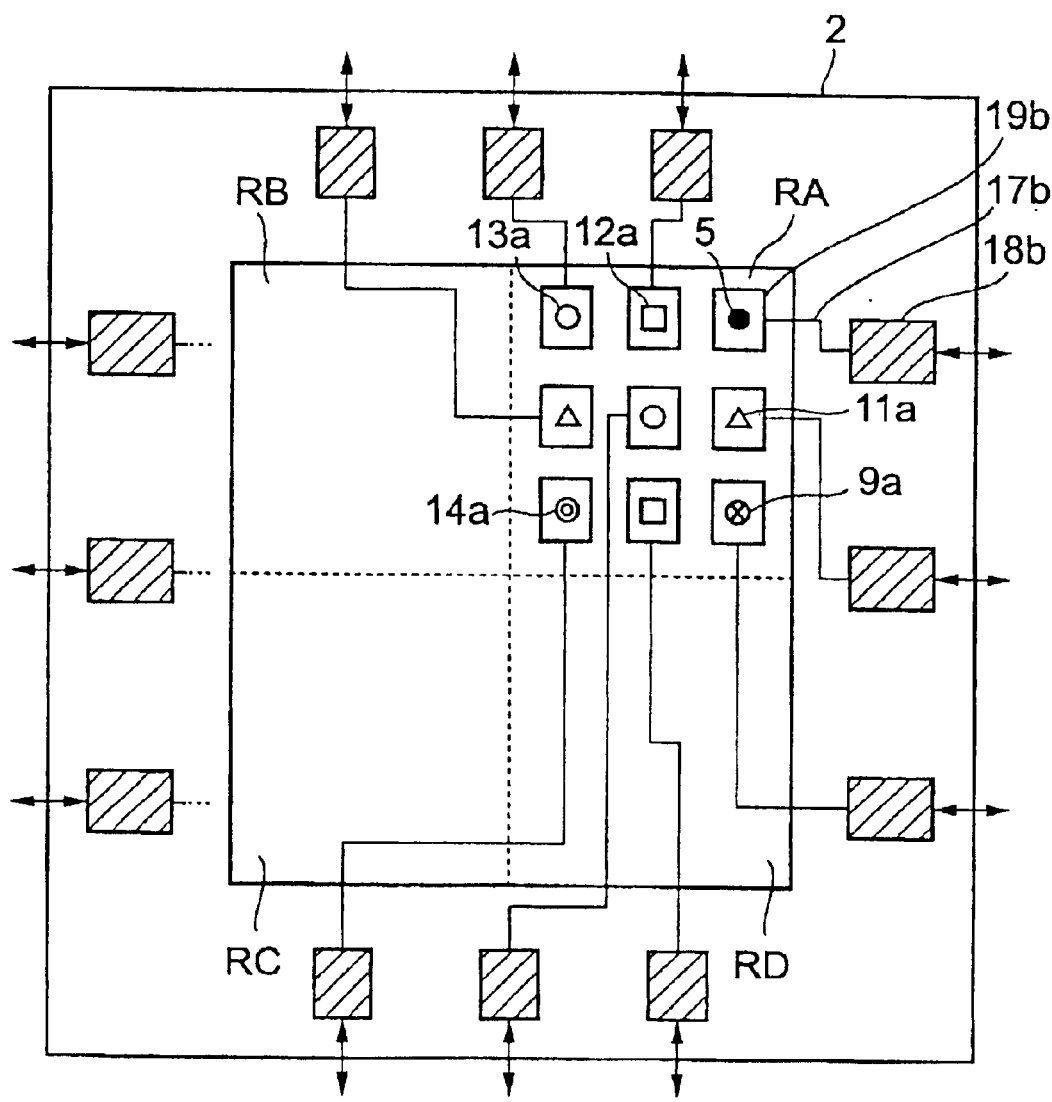
FIG. 13 is a diagram showing the construction of a testing board in the state in which the semiconductor chip of FIG. 11 is mounted thereon.

FIG. 13 shows the construction of the testing board 2 in the state the LSI chip 1 of FIG. 11 is mounted, wherein those parts corresponding to the parts described previously are designated by the same reference numerals and the description thereof will be omitted.

Referring to FIG. 13, it can be seen that the testing board 2 carries thereon a terminal 19b in correspondence to the index terminal 5 of one of the four regions RA–RD, and there is provided a connection terminal 18b for interconnection with a tester not illustrated. Thereby, the connection terminal 18b is connected to the terminal 19b by a wiring 17b.

Thus, according to the construction of FIG. 13, it becomes possible to identify the result of the testing and the region that has been tested based on the region discrimination signal obtained at the index terminal 5. Further, based on the region discrimination signal from the index terminal 5, it becomes possible to judge whether or not the entire regions RA–RD of the LSI chip 1 have been tested.

[Fourth Embodiment]

In the LSI chip 1 of the previous embodiment of FIG. 11, it should be noted that it is not necessary that the index terminals 5 are disposed in axial symmetry with respect to the form center 15.

Figure 14:
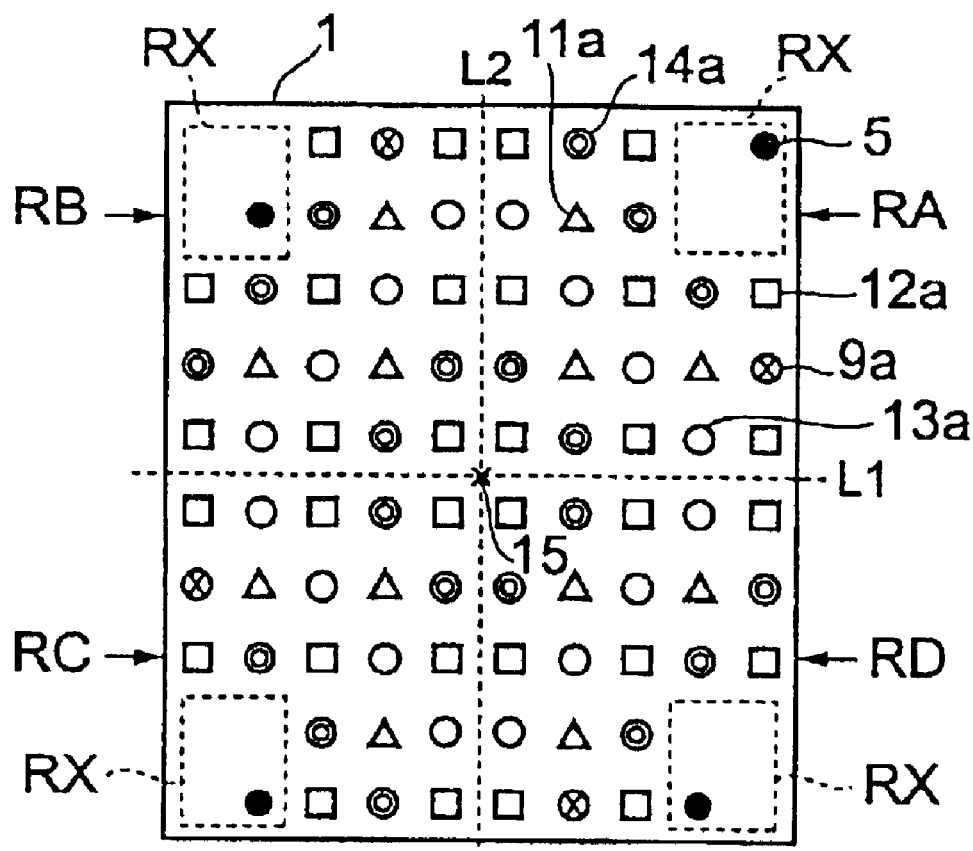
FIG. 14 is a diagram showing the construction of a semiconductor chip according to a fourth embodiment of the present invention in a bottom view.

FIG. 14 shows the bottom view of the LSI chip 1 according to a fourth embodiment of the present invention, wherein those parts corresponding to the parts described previously are designated by the same reference numerals and the description thereof will be omitted.

Referring to FIG. 14, the LSI chip 1 carries the terminals on the bottom surface thereof, wherein the terminals are arranged in axial symmetry about the form center 15 similarly to the previous embodiments except for the index terminals 5. More specifically, the index terminals 5 are disposed asymmetrically with respect to the foregoing form center 15 in correspondence to a region RX defined in each of the regions RA–RD, wherein the location of the index terminal inside the region RX is changed in each of the regions RA–RD.

Figure 15:
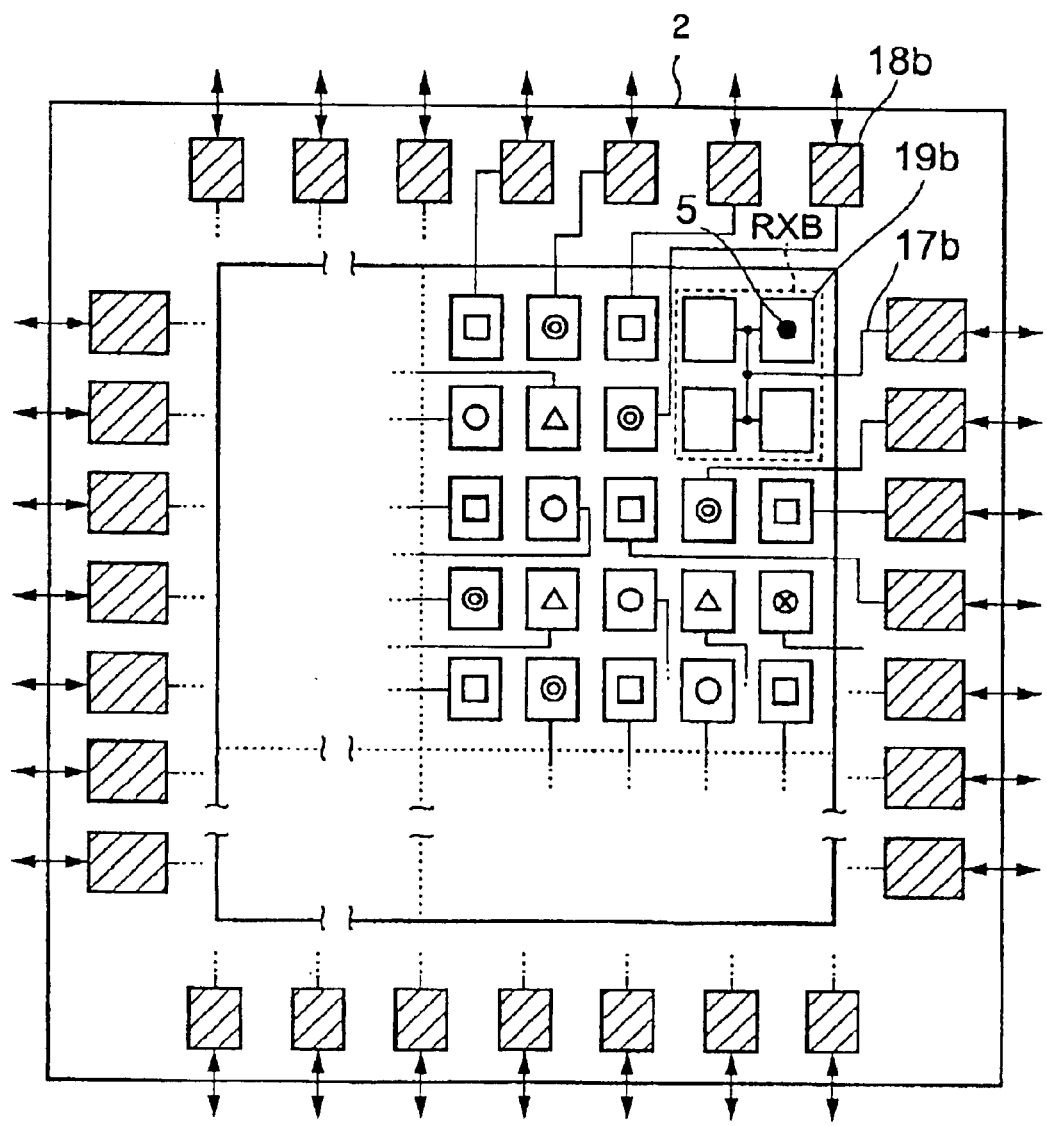
FIG. 15 is a diagram showing the construction of a testing board in the state in which the semiconductor chip of FIG. 14 is mounted thereon.

FIG. 15 shows the testing board 2 in the state that the LSI chip 1 of FIG. 14 is mounted thereon for the testing of the region RA, wherein those parts corresponding to the parts described previously are designated by the same reference numerals and the description thereof will be omitted.

Referring to FIG. 15, it can be seen that the testing board 2 of FIG. 15 has a construction similar to that of the testing board 2 of FIG. 13, except that there is defined a region RXB in the testing board 2 and that the region RXB includes four terminals 19b in electrical connection with each other, wherein the foregoing four terminals 19b are arranged so as to engage one of the index terminals 5 of the regions RA–RD when the LSI chip 1 is rotated about the form center 15 by 90 degrees. Thereby, by detecting the discrimination signals at the index terminals 5, it becomes possible to relate the result of the testing with the region that has been tested or to discriminate whether or not the testing is completed for the entire regions, while using the same testing program.

In the present embodiment, it is also possible to bestow freedom of design to other terminals by providing similar electrodes 19b in the testing board 2 in correspondence to the terminals 9a, 11a, 12a, 13a or 14a.

[Modification]

In the LSI chip 1 of the fourth embodiment, it is also possible to provide a terminal held at a predetermined voltage level in the region RX.

Figure 16:
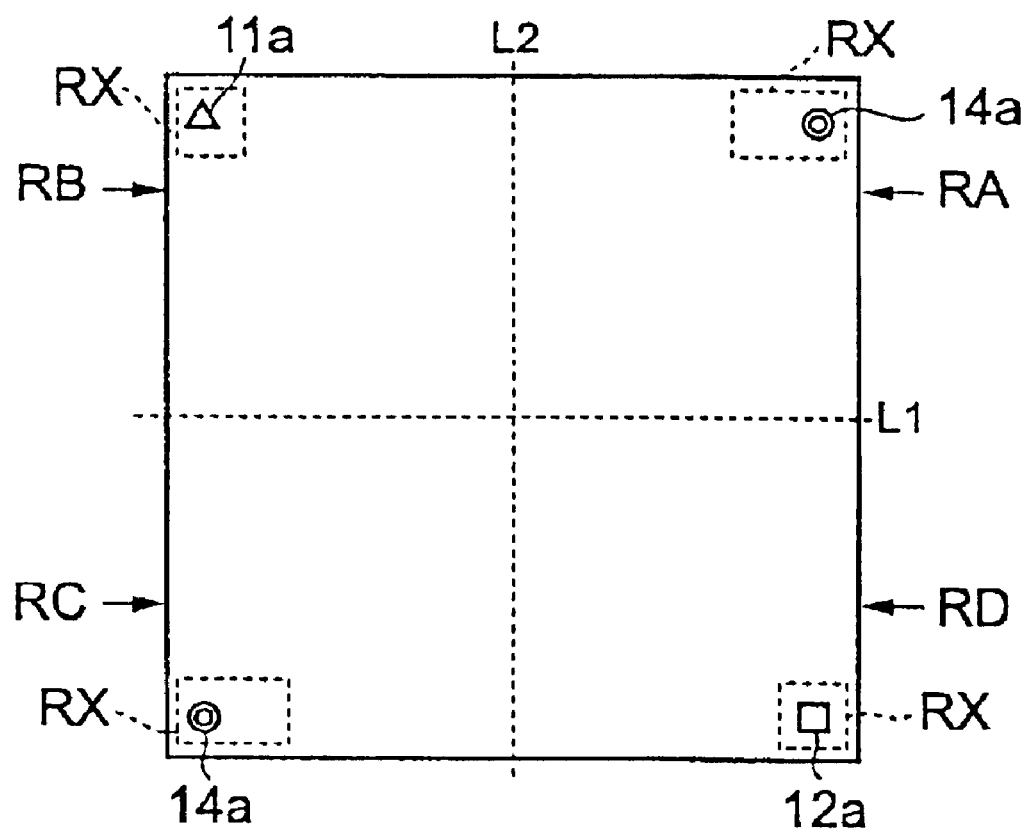
FIG. 16 is a diagram showing the construction for discriminating the tested region of the semiconductor chip of the fourth embodiment.

FIG. 16 shows such a modification of the LSI chip 1 of FIG. 14 in a bottom view, in which it can be seen that a signal output terminal 14a held at a high-level state (2.5V) is provided in the region RX at the upper-right corner of the LSI chip 1. Further, another signal output terminal 14a held at a low-level state (0.4V) is provided in the region RX at the lower-left corner of the LSI chip 1. Furthermore, a power supply (GND) terminal 12a held at a ground level (0V) is provided at a lower-right corner of the LSI chip 1 and another power supply ($V_{DD}$) terminal 11a held at a supply voltage $V_{DD}$ (3.3V) is provided at an upper-left corner of the LSI chip 1.

Thus, by detecting the voltages at these four terminals, it is possible to identify the region which is under testing.

Further, it is also possible to use the signals produced by the scanning circuit or frequency-dividing circuit used for controlling the test of the divided regions for the discrimination of the regions.

Figure 17:
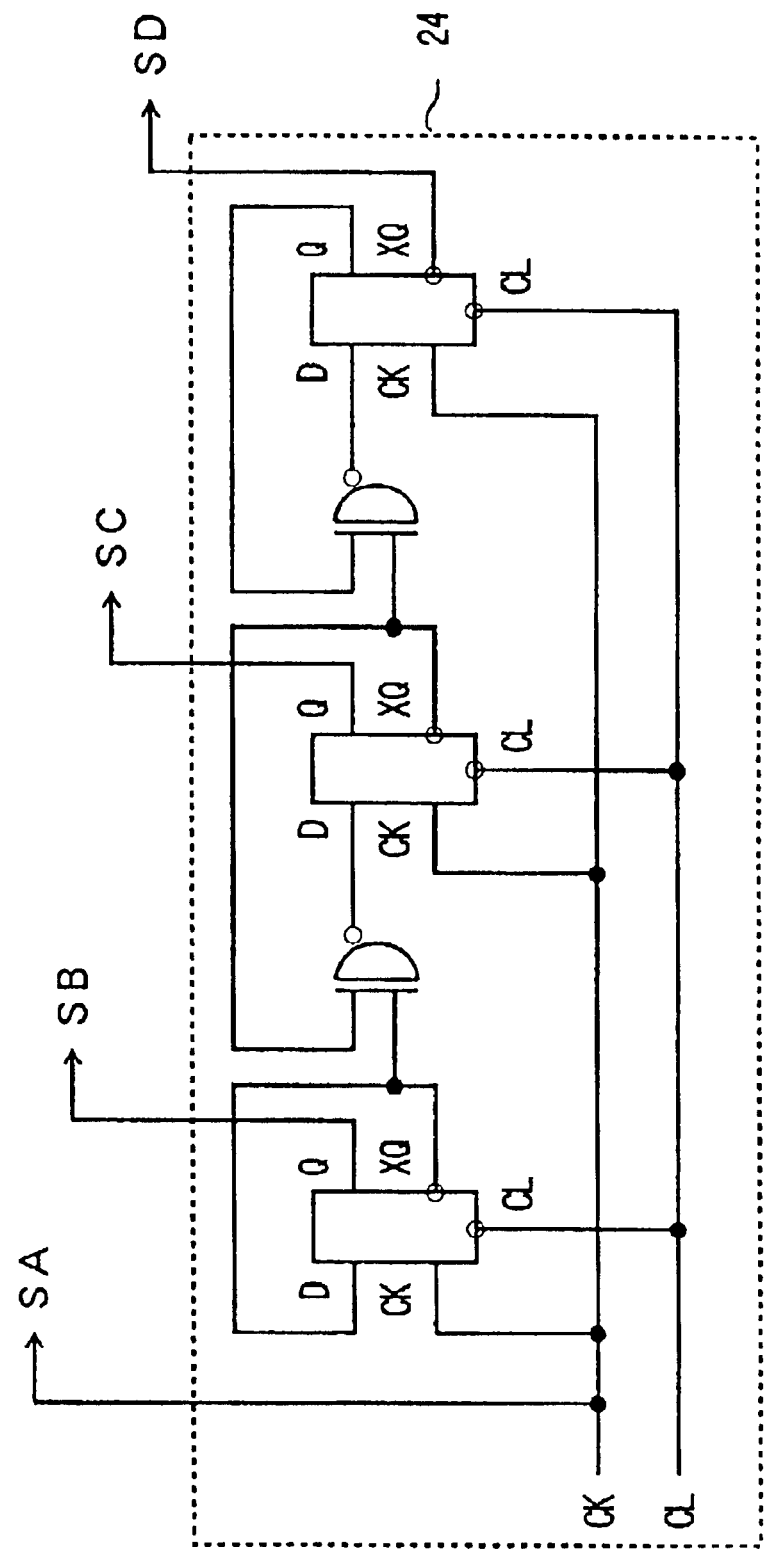
FIG. 17 is a diagram showing the construction of a circuit used for generating a discrimination signal in the construction of FIG. 16.

For example, it is possible to provide a frequency-dividing circuit 24 shown in FIG. 17 in the LSI chip 1 and supply a signal SA of the frequency-dividing circuit 24 to the terminal of the region RX in the divided region RA, and simultaneously provide a signal SB to the terminal of the region RX for the divided region RB, the signal SC to the terminal of the region RX for the divided region RC, and the signal SD to the terminal of the region RX for the divided region RD.

Further, any electrical signal that is pertinent to the divided regions RA–RD may be used for discriminating the regions.

[Fifth Embodiment]

In the embodiments described heretofore, discrimination of the regions RA–RD has been achieved by providing an index terminal to each of the regions RA–RD. However, the discrimination of the divided regions can be achieved by other different ways.

Figure 18:
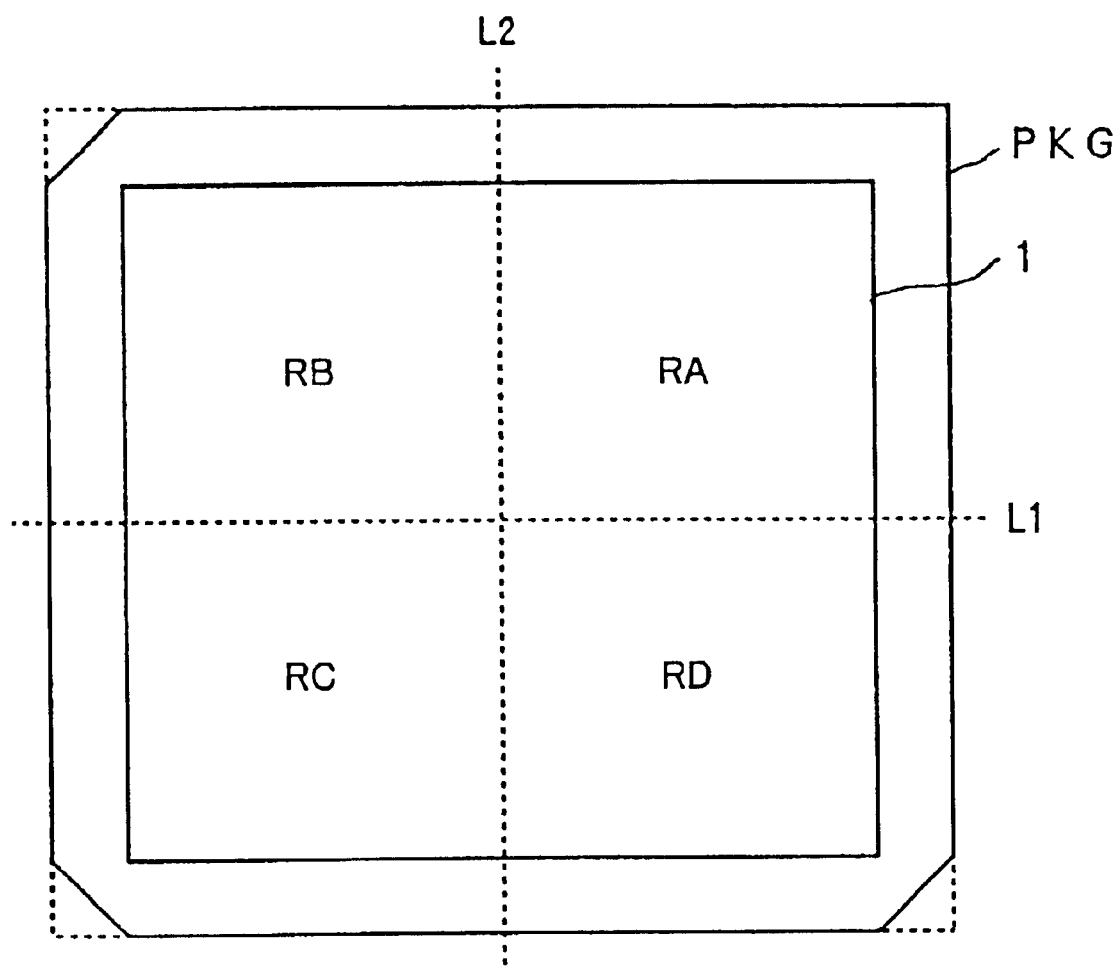
FIG. 18 is a diagram showing the construction of a packaged semiconductor chip according to a fifth embodiment of the present invention in a bottom view.

FIG. 18 shows the construction of an LSI chip 1 according to a fifth embodiment of the present invention, in which the discrimination of the divided regions RA–RD is achieved based on the outer shape of the package of the LSI chip 1.

Referring to FIG. 18, the LSI chip 1 has a package PKG, wherein the package PKG has slanted corners except for the corner of the region RA. The LSI chip 1 thus having the package PKG is mounted on the testing board 2 as represented in FIG. 19.

Figure 19:
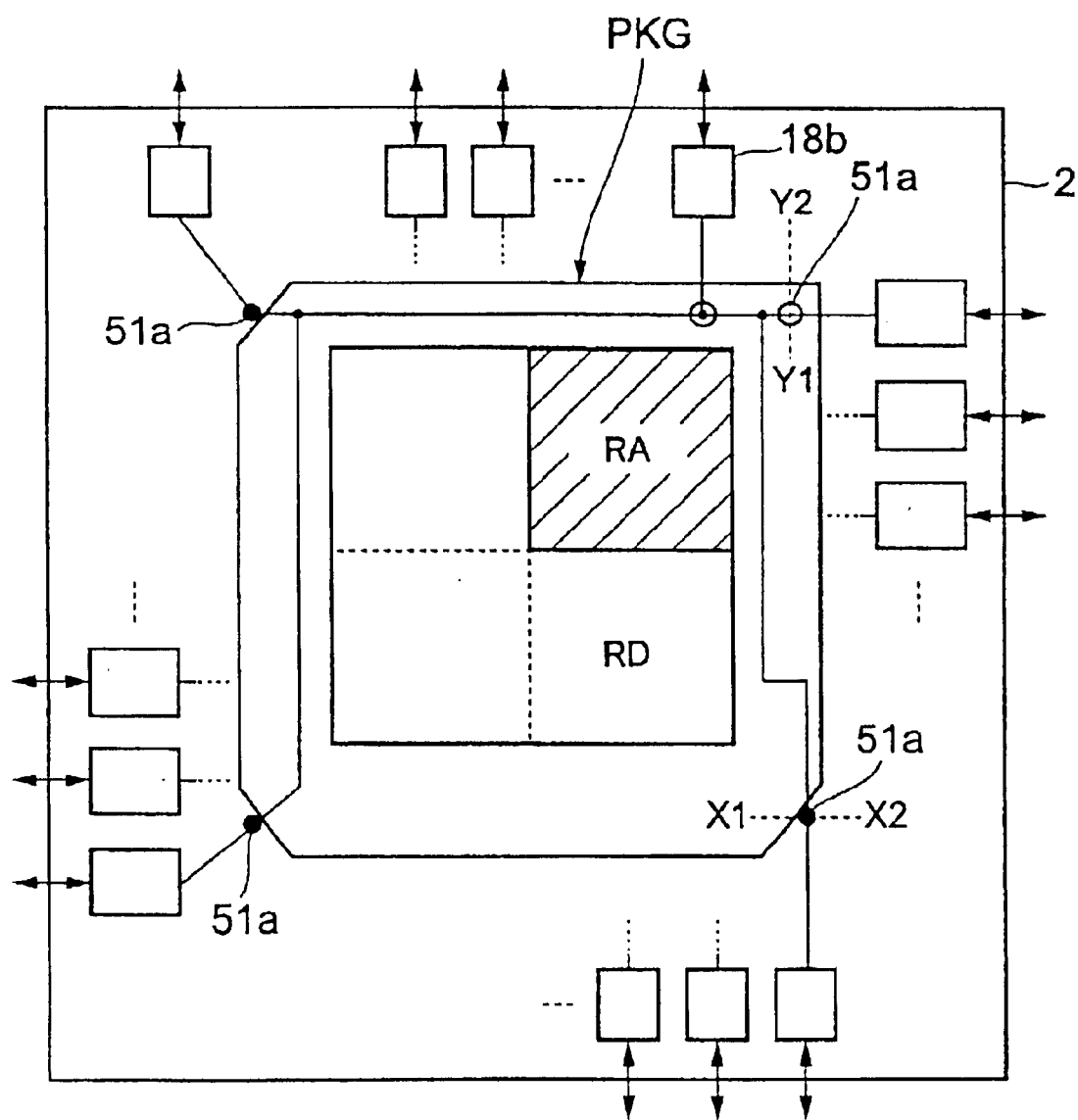
FIG. 19 is a diagram showing the construction of a testing board in the state in which the packaged semiconductor chip of FIG. 18 is mounted thereon.

Referring to FIG. 19, it can be seen that the testing board 2 has a construction similar to the testing board 2 of FIG. 13 except that there is provided a switch 51a in correspondence to the four corners of the package PKG.

Figure 20:
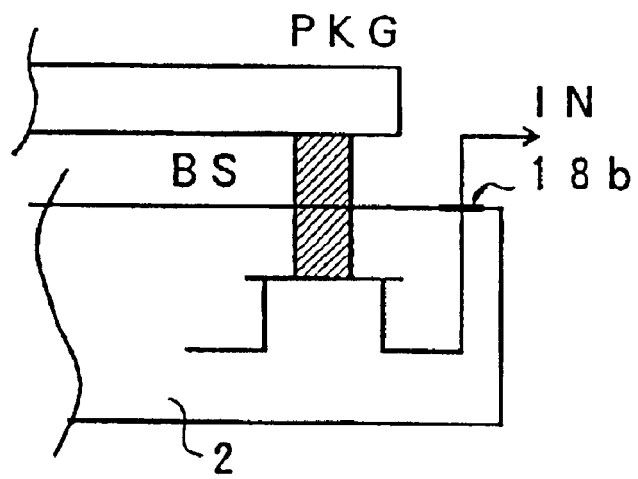
FIG. 20 is a diagram showing the construction of a switch used in the testing board of FIG. 19.
Figure 21:
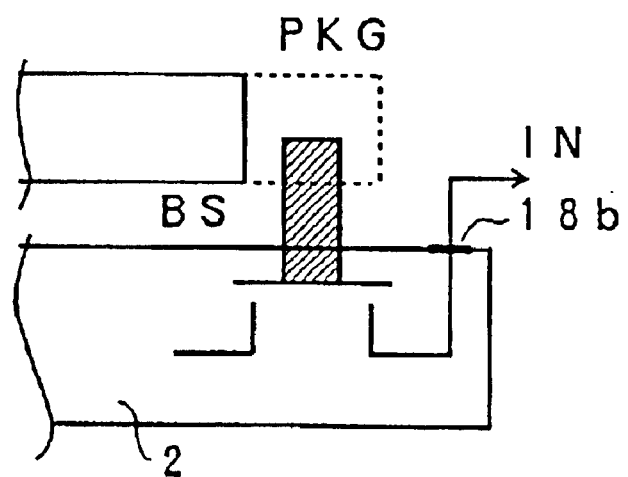
FIG. 21 is a diagram showing the construction of the switch of FIG. 20 in a cross-sectional view.

FIG. 20 shows the switch 51a in a cross-sectional view taken along a line X1—X1 of FIG. 19, while FIG. 21 shows the switch 51a in a cross-sectional view taken along a line Y1—Y1 of FIG. 19.

As can be seen in FIG. 20, the switch 51a corresponding to the region RA of the LSI chip 1 is closed when the LSI chip 1 is mounted on the testing board 2 as a result of engagement with the package PKG, and an external input signal IN is supplied to the region RA via the connection terminal 18b on the testing board 2. On the other hand, the switch 51a corresponding to the region RD is not closed even when the LSI chip 1 is mounted on the testing board 2 due to the slanting at the corner of the package PKG. Similarly, other switches 51a corresponding to the regions RB and RD remain also opened.

Thus, due to the selective closing of the switch 51a as represented in FIG. 20, the external input signal IN is supplied selectively to the region RA.

In the embodiment of FIG. 19, it is also possible to use an internal signal produced inside the LSI chip 1 for discrimination of the orientation of the chip 1.

Further, the package PKG of the present embodiment is not limited to the example of FIG. 18 but may be a one in which a single corner of the package is slanted. In this case, the orientation of the LSI chip 1 can be discriminated by detecting the opened switch 51a.

[Sixth Embodiment]

Figure 22:
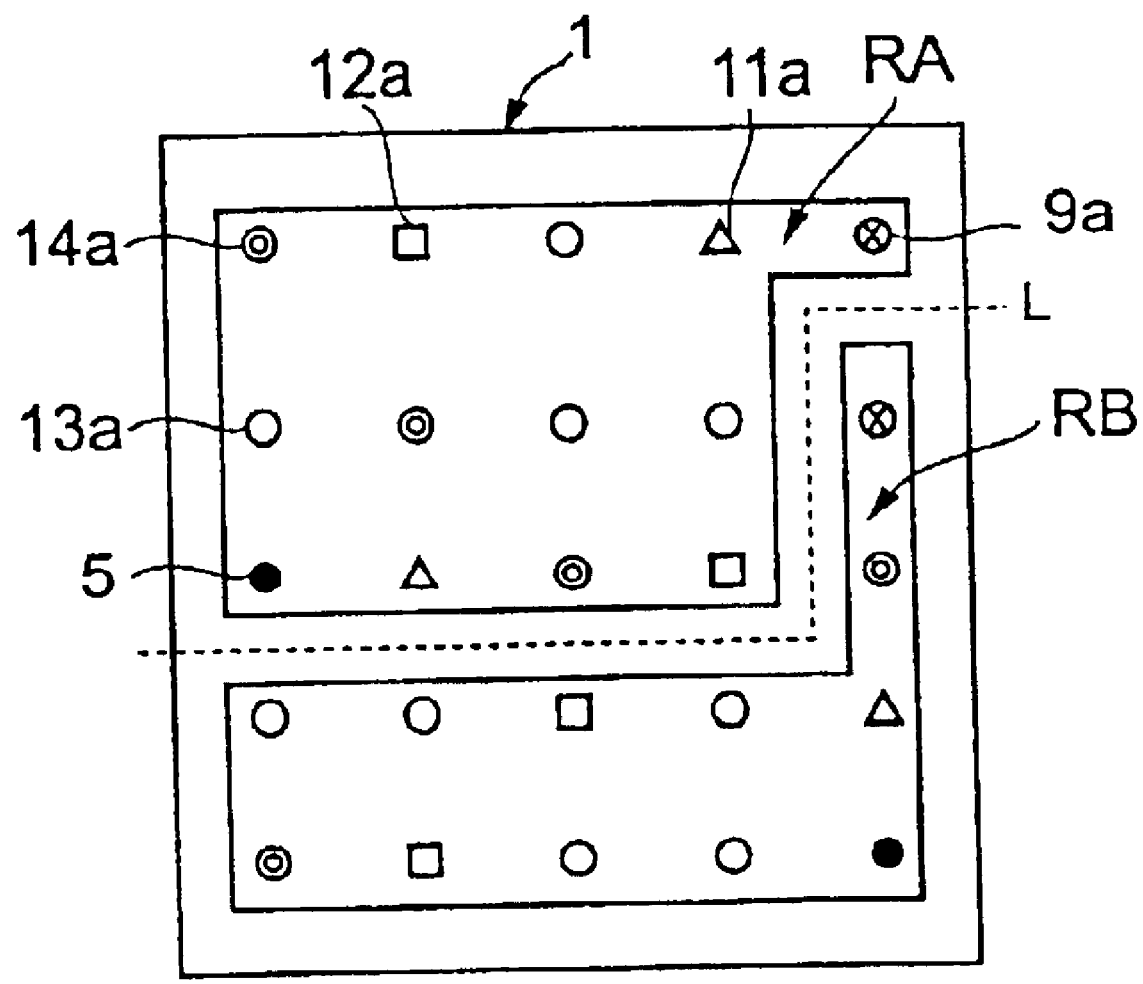
FIG. 22 is a diagram showing the construction of a semiconductor chip according to a sixth embodiment of the present invention in a bottom view.

FIG. 22 shows the construction of the LSI chip 1 according to a sixth embodiment of the present invention in a bottom view, wherein those parts corresponding to the parts described previously are designated by the same reference numerals and the description thereof will be omitted.

Referring to FIG. 22, it can be seen that the bottom surface of the LSI chip 1 is divided into the region RA and the region RB by the border line L, wherein each of the regions RA and RB includes terminals with a number smaller than the number of the terminals that are tested by the testing board 2 simultaneously. Further, it should be noted that the division of the bottom surface of the LSI chip 1 to the region RA and to the region RB is made such that each of the regions RA and RB includes at least one index terminal 5 and one test control terminal 9a.

The following TABLE I summarizes the number and the type of the terminals on the bottom surface of the LSI chip 1.

TABLE I

| | INPUT | | OUTPUT | | | |
| --- | --- | --- | --- | --- | --- | --- |
| | TEST CONTRL | IN | INDEX OUT | OUT | VDD | GND |
| REGION RA | 1 | 4 | 1 | 3 | 2 | 2 |
| REGION RB | 1 | 5 | 1 | 2 | 1 | 2 |
| MAX NUMBER | 6 | | 4 | | 2 | 2 |

As can be seen in TABLE I, there are five input terminals in all in the region RA and six input terminals in all in the region RB, wherein the number of the input terminals for each of the regions RA and RB falls within the maximum number of the terminals on the testing board used for testing the LSI chip 1. A similar conclusion holds true also to the output terminals and the power terminals.

In the example of FIG. 22, it is represented that the regions RA and RB form respective continuous regions. However, it is also possible that the regions RA and RB may be formed of an assembly of discrete regions.

Figure 23:
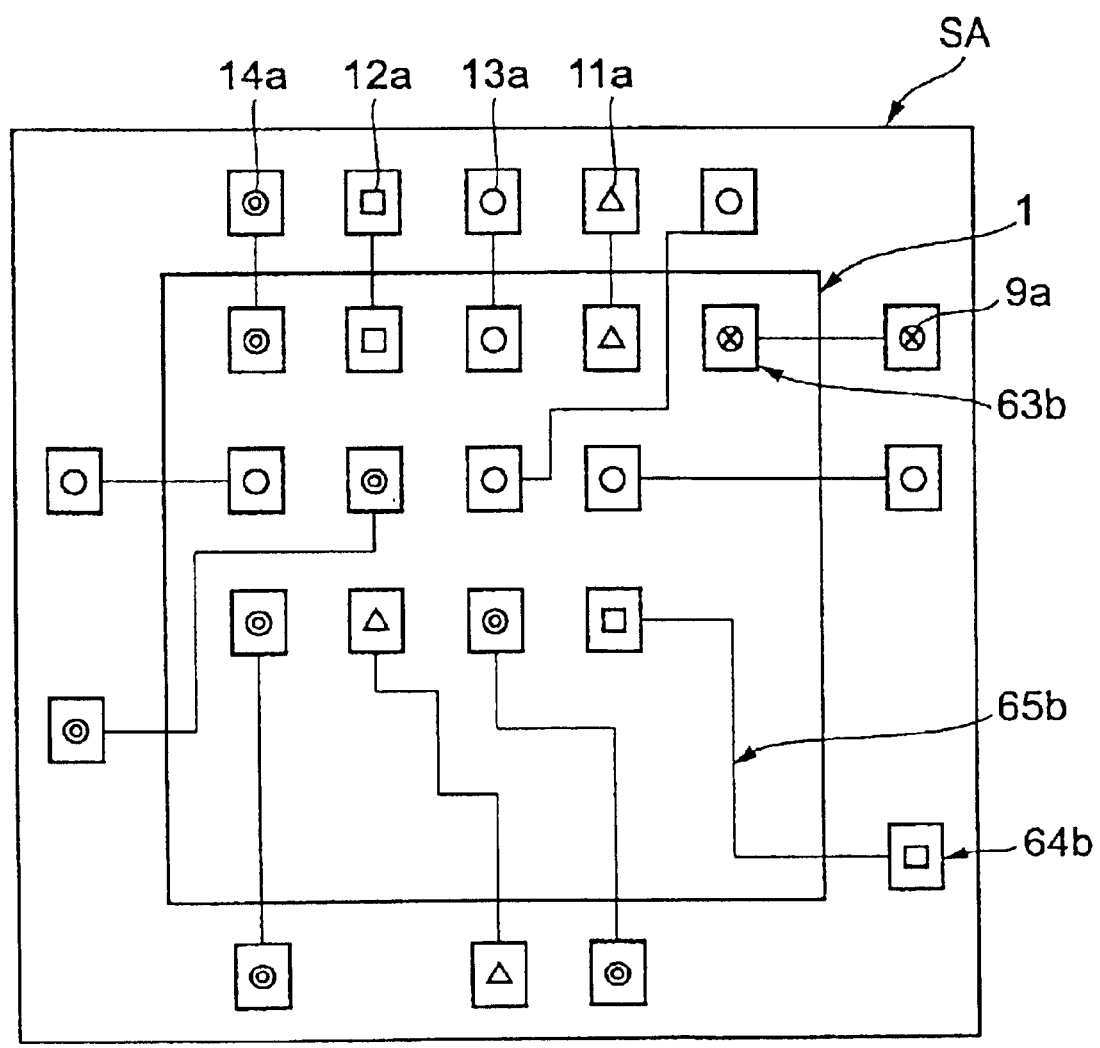
FIG. 23 is a diagram showing the construction of a socket for an A-region in the state the semiconductor chip of FIG. 22 is mounted thereon.
Figure 24:
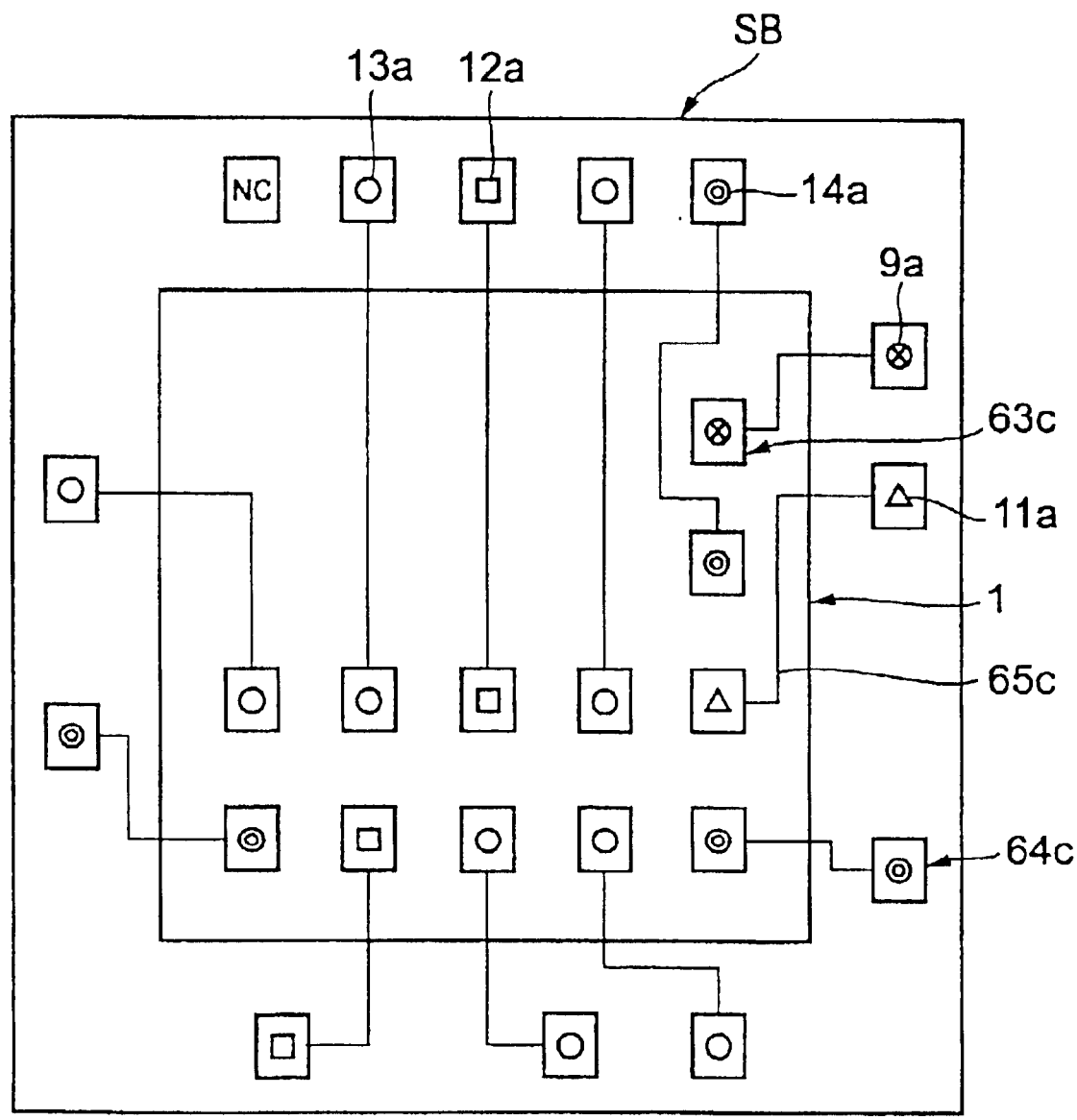
FIG. 24 is a diagram showing the construction of a socket for a B-region in the state in which the semiconductor chip of FIG. 22 is mounted thereon.

FIGS. 23 and 24 respectively show the construction of sockets SA and SB used for holding the LSI chip 1 of FIG. 22, wherein the socket SA is used for testing the region RA of the LSI chip 1, while the socket SB is used for testing the region RB of the LSI chip 1.

Referring to FIGS. 23 and 24, each of the sockets SA and SB includes terminals 63b and 63c for contacting with the terminals on the bottom surface of the LSI chip 1 and terminals 64b and 64c for contacting with the terminals on the testing board (not illustrated). The terminal 63b or 63c is connected the terminal 64b or 64c via a wiring 65b or 65c.

Comparing FIGS. 23 and 24, it will be noted that the type of the terminal of the LSI chip 1 to be connected to the terminal 64b (see FIG. 23) is different from the type of the terminal of the LSI chip 1 to be connected to the terminal 64c (see FIG. 24). This means that it is necessary to use different test programs for conducting a test to the construction of FIG. 23 and for conducting a test to the construction of FIG. 24.

Figure 25:
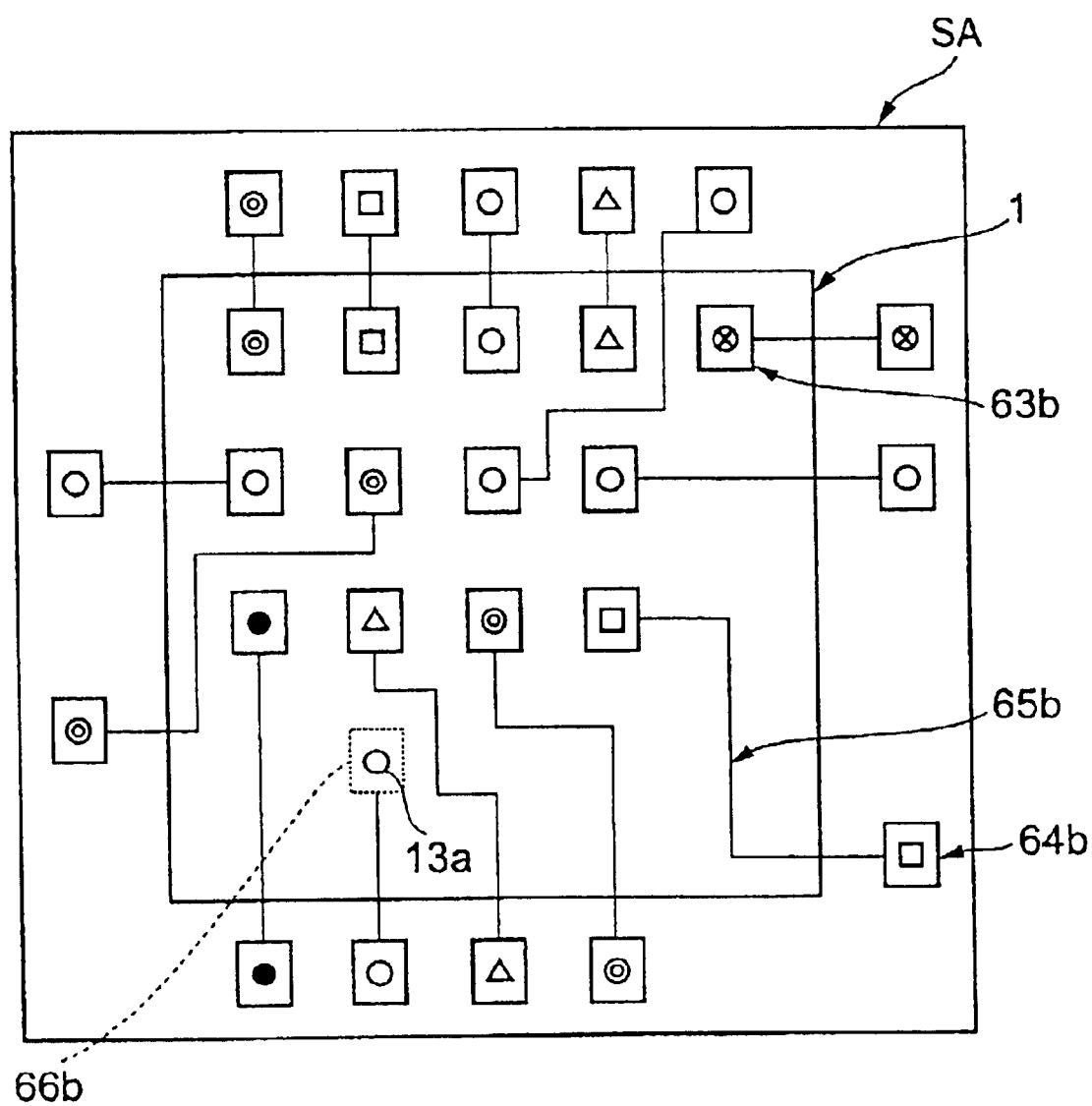
FIG. 25 is a diagram showing the construction of a socket for an A-region according to the sixth embodiment in the state in which the semiconductor chip of FIG. 22 is mounted thereon.
Figure 26:
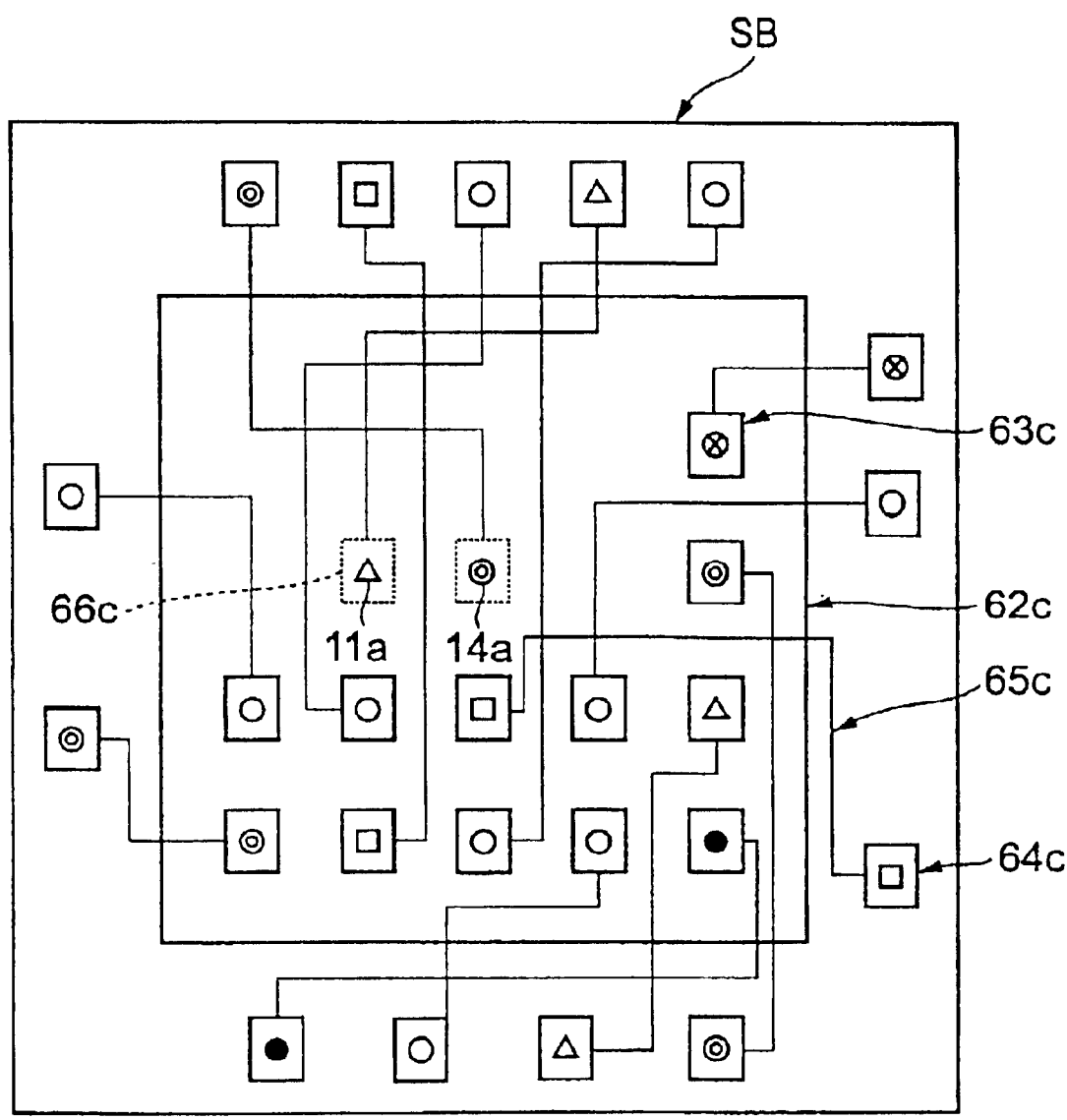
FIG. 26 is a diagram showing the construction of a socket for a B-region according to the sixth embodiment in the state in which the semiconductor chip of FIG. 22 is mounted thereon.

FIG. 25 shows the construction of the socket SA for testing the region RA of the LSI chip 1 according to a sixth embodiment of the present invention, while FIG. 26 shows the construction of the socket SB used for testing the region RB of the LSI chip 1, also according to the sixth embodiment of the present invention.

Referring to FIG. 25, the socket SA has a construction similar to that of the socket SA of FIG. 23 for the region RA, except that the socket SA of FIG. 25 includes a dummy terminal 66b. Such a dummy terminal 66b is provided in view of the fact that the number of the input terminals in the region RA is smaller than the number of the input terminals in the region RB. See TABLE I explained before. By providing the dummy terminal 66b, the testing board 2 becomes capable of making contact with the input terminals of both the region RA and the region RB. The dummy terminal 66b thus provided makes a contact with the input terminal 13a in the region RB.

Referring to FIG. 26, the socket SB has a construction similar to that the of socket SB of FIG. 24 for the region B, except that the socket SB of FIG. 26 includes two dummy terminals 66c. Such a dummy terminal 66c is provided in view of the fact that the number of the output terminals is smaller in the region B than in the region RA and that the number of the power terminals ($V_{DD}$) is smaller in the region B than in the region A. See TABLE I. The two dummy terminals 66c thus provided make a contact with the signal output terminal 14a and the power terminal ($V_{DD}$) 11a in the region RA.

Thus, by providing dummy terminals both in the region RA and in the region RB, it becomes possible to use the same arrangement for the terminals 64b and 64c on the testing board 2.

Figure 27:
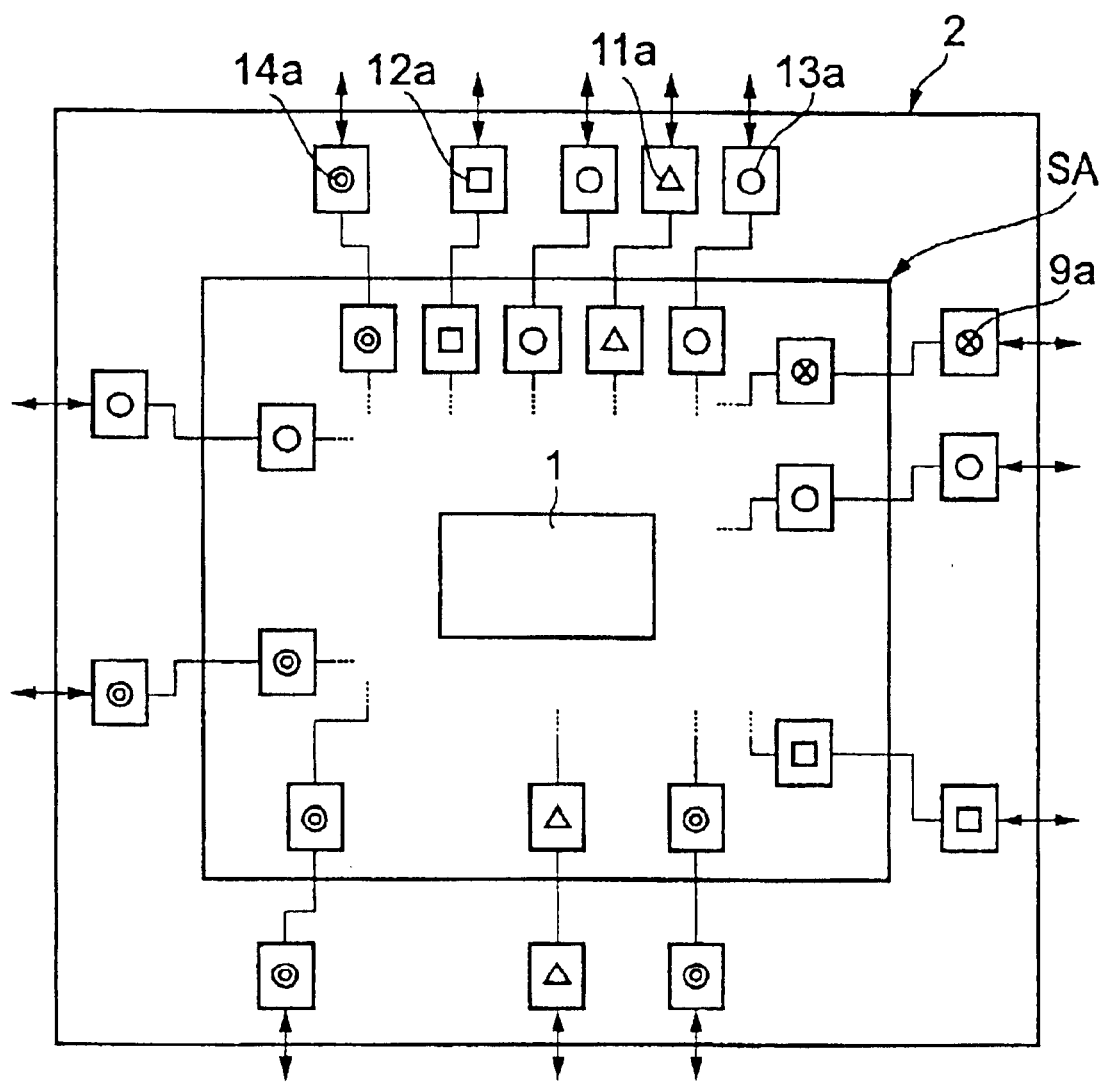
FIG. 27 is a diagram showing the construction of a test board in the state in which the socket of FIG. 23 is mounted thereon.
Figure 28:
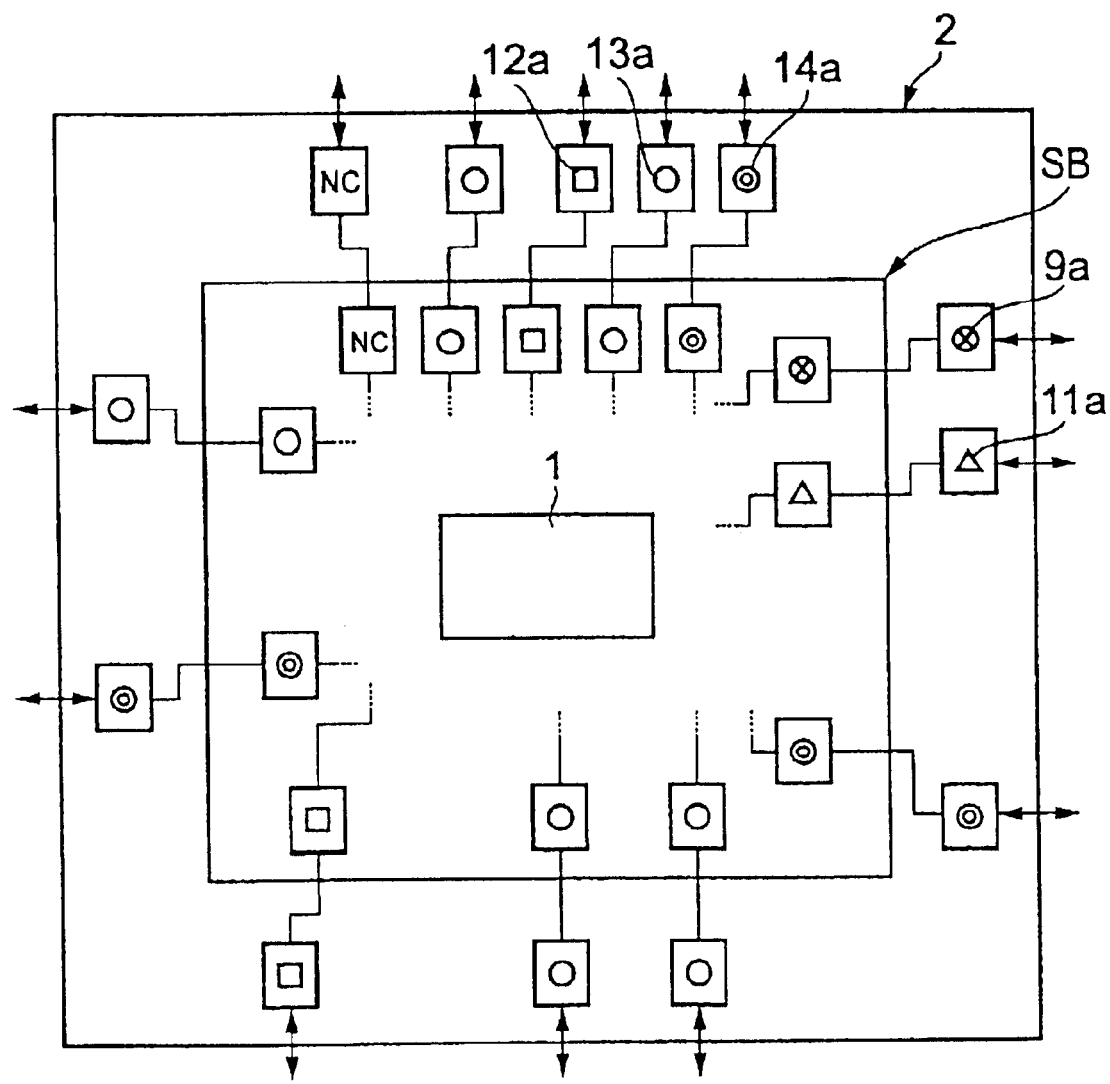
FIG. 28 is a diagram showing the construction of a test board in the state in which the socket of FIG. 24 is mounted thereon.

FIG. 27 shows the case in which the socket of FIG. 23 is mounted on the testing board for testing the region RA of the LSI chip 1, while FIG. 28 shows the case in which the socket of FIG. 24 is mounted on the testing board for testing the region RB of the LSI chip 1.

Comparing FIGS. 27 and 28, it will be understood that the interconnection between the testing board 2 and the tester (not shown) changes depending on what region is tested. Thus, in the case of using the sockets SA or SB of FIG. 23 or FIG. 24, it has been necessary, not only to prepare two different sockets SA and SB, but also to change the test program that is loaded into the tester.

Figure 29:
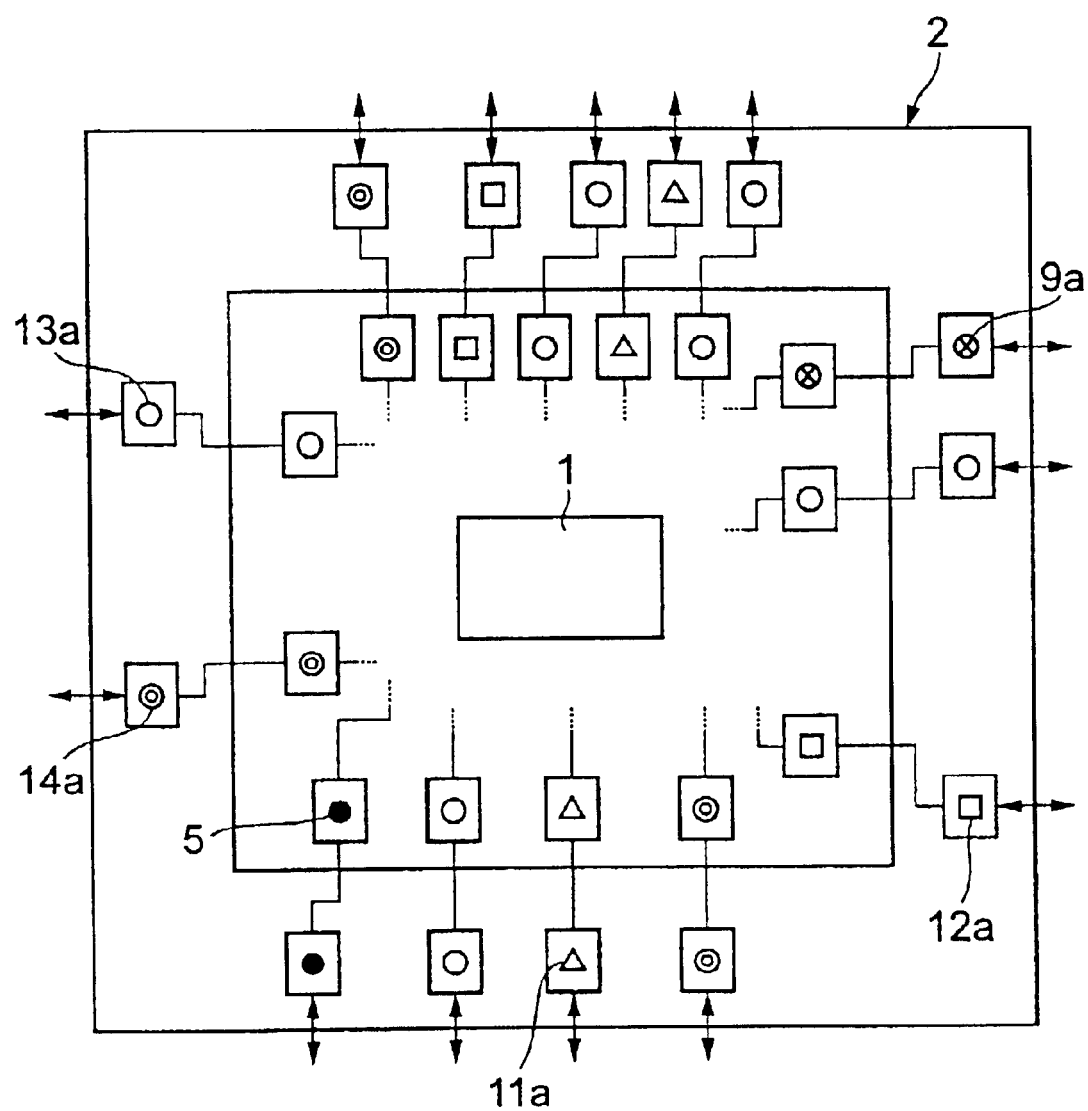
FIG. 29 is a diagram showing the construction of a test board in the state in which the socket of FIG. 25 is mounted thereon.

FIG. 29, on the other hand, show the construction in which the socket SA of FIG. 25 for the region RA or the socket SB of FIG. 26 for the region RB is mounted on the testing board 2.

As represented in FIG. 29, the interconnection between the testing board 2 and the tester does not change in the case in which the socket SA of FIG. 25 is used and in the case in which the socket SB of FIG. 26 is used. Thus, by using the construction of FIG. 29, it is possible to test both the region RA and the region RB of the LSI chip 1 of FIG. 22 by merely replacing the socket SA and SB, while using the same testing program.

Figure 30:
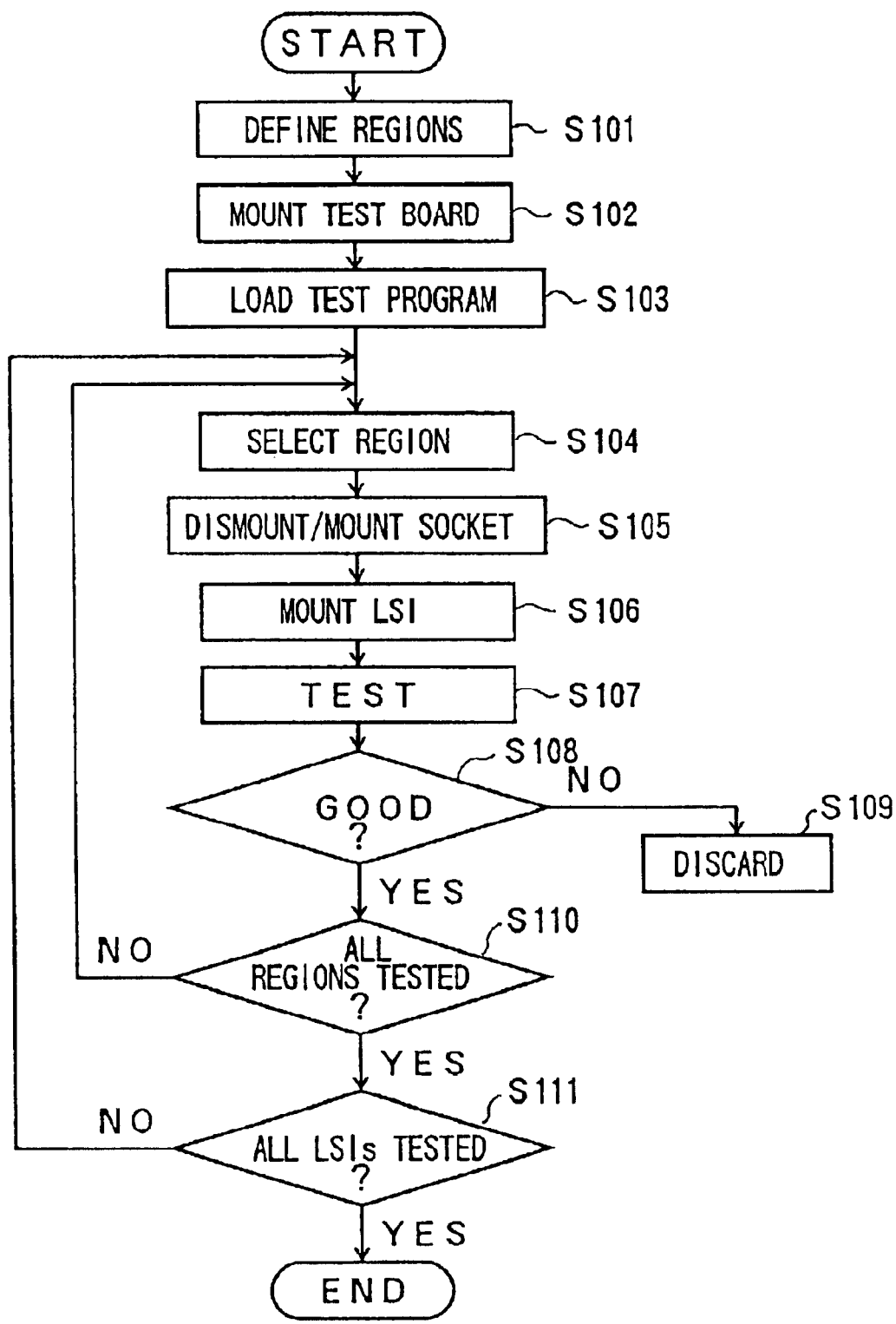
FIG. 30 is a flowchart showing a testing method according to the sixth embodiment of the present invention.

FIG. 30 shows the flowchart of testing the LSI chip 1 of FIG. 22 by using the test construction of FIG. 29.

Referring to FIG. 30, a step S101 is conducted first, in which the bottom surface of the LSI chip 1 is divided into the regions RA and RB by defining the boundary line L. Thereby, the boundary line L is defined such that the total number of the terminals does not exceed the number of the terminals on the testing board in any of the regions RA and RB.

Next, in the step S102, the testing board 2 is mounted on the tester, and a test program is loaded on the tester in the step S103. Thereby, it should be noted that the interconnection between the testing board 2 and the tester does not change in the socket SA and in the socket SB as explained with reference to FIG. 29. Thus, only one testing program is loaded in the step S103 as a common program for testing the region RA and the region RB of the LSI chip 1.

Next, in the step S104, the region to be tested is selected. In the description hereinafter, the explanation will be made for the case in which the region RA is selected for the testing.

After the region RA is thus selected in the step S104, a step S105 is conducted in which the socket SA of FIG. 25 for testing the region RA is mounted on the testing board 2 as indicated in FIG. 29.

Next, in the step S106, the LSI chip 1 is mounted on the socket SA, which is already mounted on the testing board 2. In the step S106, each of the terminals of the LSI chip 1 is contacted with corresponding terminals on the socket SA.

Next, in the step S107, various signals and supply voltages are supplied from the terminals on the testing board 2 to the corresponding terminals of the LSI chip 1 via the socket SA under control of the foregoing test program, and the functional test is conducted on the region RA.

Next, in the step S108, a discrimination is made whether the LSI chip 1 is good or defective for the region RA, based on the signals that are obtained from the terminals of the region RA of the LSI chip 1.

Thus, when it is decided in the step S108 that the tested LSI chip 1 is defective, the process proceeds to the step S109 and the tested LSI chip 1 is excluded from further testing. On the other hand, when it is decided that the tested LSI chip 1 is good, a discrimination is made in the step S110 whether or not the functional test is completed for all of the regions RA and RB.

As the functional test for the region RB is not yet finished, the process returns to the step S104 and the LSI chip 1 is dismounted from the testing board 2 together with the socket SA. Further, the region RB is selected in the step S104.

After the selection of the region RB in the step S104, the socket SB of FIG. 28 is mounted on the testing board 2 in the step S105 by means of an automatic handler, and the steps S106–S111 are repeated.

When it is judged in the step S110 that the entire regions of the LSI chip 1 are tested, the process proceeds to the step S111 wherein a discrimination is made whether or not the entire LSI chips are tested. If the result of the step S111 is NO, the process returns to the step S104, while if the result of the step S111 is YES, the testing is finished.

According to the process of FIG. 30, it is noted that the testing of a next LSI chip is commenced only after the entire regions are tested for the current LSI chip. Thereby, the step of replacing the socket in the step S105 has to be made each time the testing for one region is completed.

Figure 31:
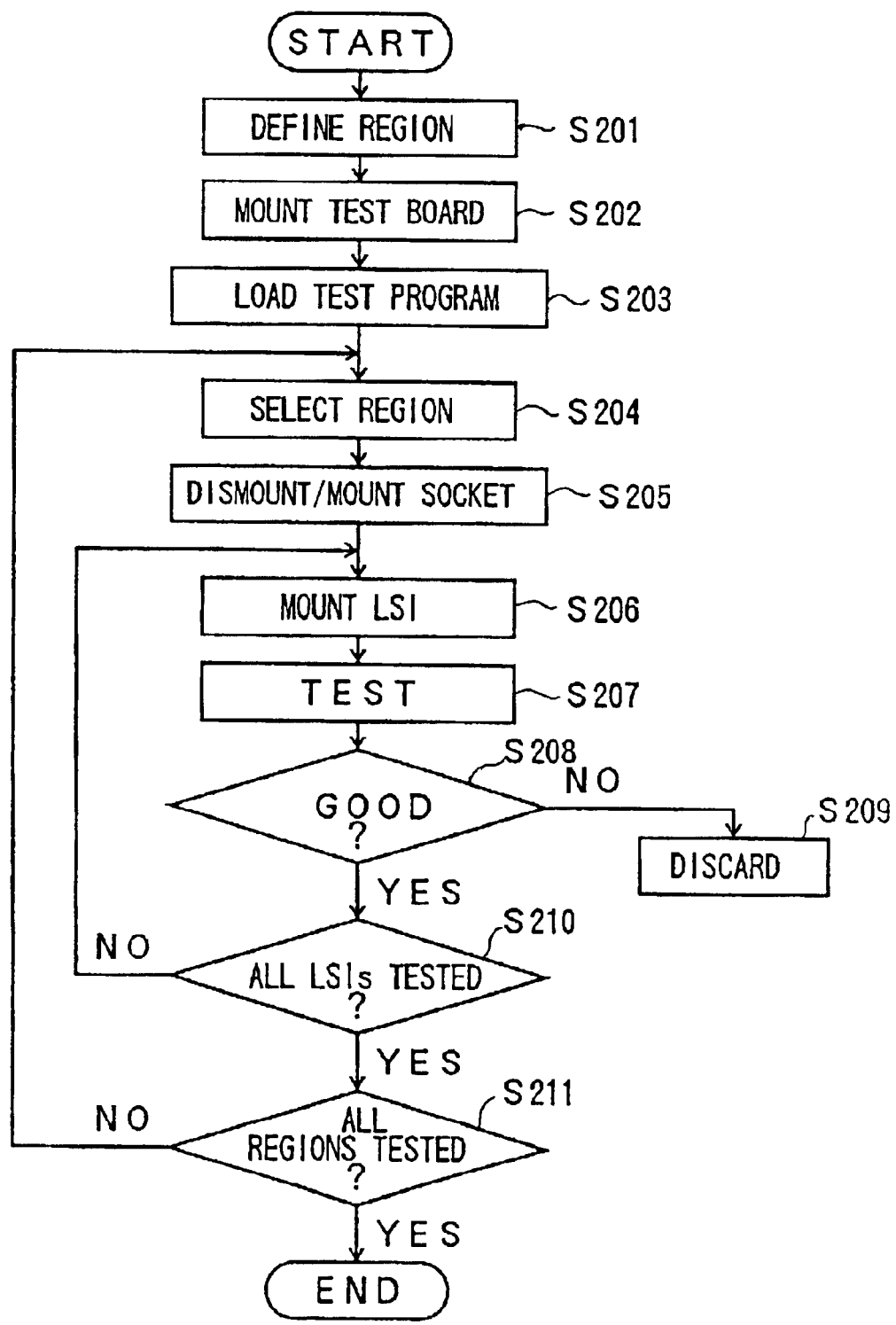
FIG. 31 is a flowchart showing another testing method according to the sixth embodiment of the present invention.

FIG. 31 shows a testing method that avoids the foregoing problem of replacing the socket each time the testing for one region is completed.

Referring to FIG. 31, the process starts with a step S201 and proceeds up to the step S209 similarly to the process of FIG. 30 for the part between the step S101 and the step S109 explained before. Thus, when it is judged in the step S208 that the tested region of the LSI chip 1 is good, the LSI chip 1 is dismounted from the testing board 2 and a next LSI chip is mounted on the testing board 2.

Further, a discrimination is made in the step S210 corresponding to the step S111 of FIG. 30 as to whether or not the entire LSI chips are tested for the selected region selected in the step S204. When the result of the step S210 is NO, the process returns to the step S206 and a next LSI chip is mounted on the socket that is already mounted on the testing board 2. Thus, by repeating the steps S206 through S210, the entire LSI chips are tested for the selected region selected in the step S204.

Next, a discrimination is made in the step S211 whether or not the functional test is completed for the entire regions. Thus, when there are untested regions, the process returns to the step S204 and a next testing region is selected. After the step S204, the socket on the testing board 2 is replaced in the step S205 and the steps S206 through S210 are repeated.

After it is judged that the testing is completed for the entire regions, the functional test is terminated.

It should be noted that the testing process of FIG. 30 has an advantageous feature in that the number of operation for replacing the sockets on the testing board can be reduced substantially. On the other hand, the process of FIG. 31 has a drawback in that the final result of the testing is not obtained until the testing is completed for the entire LSI chips. Thus, when it is possible to use an automatic mechanism for replacing the socket, the process of FIG. 30 would be more preferable.

In any of the processes of FIGS. 30 and 31, the use of the sockets SA and SB shown in FIGS. 25 and 26 achieves a substantial simplification in the testing procedure of LSI chips, by using a single testing board and a single testing program throughout the testing of different regions on the LSI chip. In the present embodiment, too, the number of the terminals on the LSI chip may exceed the number of the terminals on the testing board.

Thus, the present invention described heretofore can achieve an effective and efficient DC (Direct Current) testing of LSI chips, by directly engaging terminals on the tested LSI chips with the corresponding terminals on the testing board and by supplying predetermined test voltages. As a result of such a DC testing, it is possible to measure various important DC characteristics of the LSI chip, including operational current, standby current, substrate current, leakage current of input/output terminals, and conduction/non-conduction, wherein the testing of the present invention is particularly useful for testing the leakage current of the input/output terminals or conduction/non-conduction.

Further, the present invention is by no means limited to the embodiments described heretofore, but various variations and modifications may be made without departing from the scope of the invention.

The present application is based on Japanese priority applications No.10-118266 and No.11-120619 respectively filed on Apr. 28, 1998 and on Apr. 27, 1999, the entire contents of which are hereby incorporated by reference.

What is claimed is:

1. A method of fabricating a semiconductor device including a step of testing said semiconductor device, said step of testing comprising the steps of:

defining, in a principal surface of a semiconductor chip forming said semiconductor device, a plurality of regions each including a plurality of contact electrodes such that a first contact electrode provided in a first region for carrying signals of a first type, is in a symmetrical relationship with a second contact electrode in a second region and used for carrying a signal of said first type, about a center of symmetry locating in said principal surface;

mounting said semiconductor chip on a testing board in a first state such that said first contact electrode is contacted with a corresponding first contact pin provided on said testing board;

carrying out a testing of said semiconductor chip by using said first contact electrode;

rotating said semiconductor chip with respect to said testing board about said center of symmetry, such that said second contact electrode is contacted with said first contact pin of said testing board; and carrying out a testing of said semiconductor chip by using said second contact electrode.

2. A method as claimed in claim 1, wherein said step of testing said semiconductor chip by using said first contact electrode and said step of testing said semiconductor chip by using said second contact electrode are carried out according to a common test program.

* * * * *